United States Patent [19]
Hollander et al.

[11] Patent Number: 6,095,682
[45] Date of Patent: Aug. 1, 2000

[54] PYROMETER MULTIMETER

[75] Inventors: Milton Bernard Hollander, Stamford; Michael A. Macchiarelli, Jr., Shelton; Shahin Baghai, Trumbull, all of Conn.

[73] Assignee: Omega Engineering, Inc., Stamford, Conn.

[21] Appl. No.: 09/196,191

[22] Filed: Nov. 20, 1998

Related U.S. Application Data

[60] Provisional application No. 60/066,315, Nov. 21, 1997, provisional application No. 60/066,803, Nov. 26, 1997, provisional application No. 60/077,896, Mar. 13, 1998, provisional application No. 60/085,633, May 15, 1998, and provisional application No. 60/094,081, Jul. 24, 1998.

[51] Int. Cl.$^7$ ........................................ G01J 5/02
[52] U.S. Cl. .................... 374/121; 374/133; 374/208; 374/121
[58] Field of Search .................... 374/121, 126, 374/163

[56] References Cited

U.S. PATENT DOCUMENTS

| | | | |
|---|---|---|---|
| 4,348,653 | 9/1982 | Tsuzuki et al. | 374/163 |
| 4,428,685 | 1/1984 | Lemelson et al. | 374/163 |
| 4,505,600 | 3/1985 | Suzuki et al. | 374/163 |
| 4,591,256 | 5/1986 | Matsumura . | |
| 4,881,823 | 11/1989 | Tanaka et al. | 374/126 |
| 4,934,830 | 6/1990 | Rieger et al. | 374/121 |
| 5,258,871 | 11/1993 | Gupta . | |
| 5,368,392 | 11/1994 | Hollander et al. | 374/121 |
| 5,657,380 | 8/1997 | Mozer | 379/88 |
| 5,743,644 | 4/1998 | Kobayashi et al. | 374/126 |
| 5,836,692 | 11/1998 | Pompei | 374/126 |
| 5,836,694 | 11/1998 | Nguyen | 374/121 |

OTHER PUBLICATIONS

Gaylord, Thomas K., Moharam, M. G., "Analysis and Applications of Optical Diffraction by Gratings," Proceedings of the IEEE, vol. 73, No. 5, May 1985, pp. 894–937.

The Optometrics Group, catalogue Transmission Grating Beamsplitters, 1993, pp. 60–61.

McCormick, F. B., "Generation of Large Spot Arrays From a Single Laser Beam by Multiple Imaging with Binary Phase Gratings," Optical Engineering, Apr. 1989, vol. 28 No. 4, pp. 299–304.

Harvey, James E.; Scott, Marion L., "Hole Grating Beam Sampler–Versatile High–Energy Laser (HEL) Diagnostic Tool," Optical Engineering, Nov./Dec. 1981, vol. 20, No. 6, pp. 881–886.

Haidner, Helmut; Kipfer, Peter; Sheridan, John T.; Schwider, Johannes; Streibl, Norbert; Lindolf, Jürgen; Collischon, Martin; Lang, Anette; Hutfless, Joachim, "Polarizing Reflection Grating Beamsplitter for the 10.6–$\mu$m Wavelength," Optical Engineering, Aug. 1993, vol. 32, No. 8, pp. 1860–1865.

(List continued on next page.)

*Primary Examiner*—Peter S. Wong
*Assistant Examiner*—Pia Tibbits
*Attorney, Agent, or Firm*—William A. Drucker

[57] ABSTRACT

The combination in an instrument of a multimeter and an instrument having apparatus for determining a non-contact measurement of radiation perceived at a distance from a surface. The instrument may further have an apparatus for determining temperature of that surface by direct contact therewith. The non-contact apparatus may have optical sighting means and laser sighting means, and means for determining emissivity of the surface. Provision may be made for recording data, e.g. a data logger. Audio output may be provided in accordance with temperature determinations, and may include speech synthesizing. Conveniently, the instrument is adapted for holding in the hand, for example by a pistol-grip handle, and/or for mounting on a tripod as well as a threaded connection with a wrist strap or a tripod. Temperatures derived respectively from infrared radiation, and from direct contact, have separate displays. The multimeter and the temperature instrument may have means for their control by vocal command.

2 Claims, 17 Drawing Sheets

OTHER PUBLICATIONS

Molesini, G.; Pedrini, G.; Quercioli, F., "Laser Unequal Path Interferometer Configurations by Grating Splitting at the Fourier Plane," Optical Engineering, Sep./Oct. 1984, vol. 23, No. 5, pp. 646–649.

Mokry, Patricia A., "Unique Applications of Computer–Generated Diffractive Optical Elements," SPIE vol. 1052 Holographic Optics: Optically and Computer Generated (1989), pp. 163–171.

Munnerlyn, C. R., "A Simple Laser Interferometer," Applied Optics, Apr. 1969, vol. 8, No. 4, pp. 827–829.

Miler, Miroslav, "Photoresist as a Recording Material for Holographic Elements," SPIE vol. 2108, 8 pp. Date: Feb. 19, 1993.

Schmidt, J.; Völkel, R.; Stork, W.; Sheridan, J. T.; Schwider, J.; Streibl, N.; Durst, F.; "Diffractive Beam Splitter for Laser Doppler Velocimetry," Optical Letters, Sep. 1, 1992, vol. 17, No. 17, pp. 1240–1242.

Kim, Richard C.; Case, Steven K.; "Holographic Beamsplitter for Multiple Plane Wave Formation with Matched Phasefronts," SPIE (1989) vol. 1052, pp. 52–64.

Shuying, Wang; Chun, Lei, "New Method of Designing High–Efficiency Multi–Beam Light–Splitter," SPIE vol. 1973, pp. 87–93, Date: Aug. 1993.

Lu, Xuenong; Wang, Ying; Wu, Minxian; Jin, Guofan, "*The Fabrication of a 25×25 Multiple Beam Splitter*," vol. 72, No. 3.4, pp. 157–162, Mar. 2, 1989.

Azzam, R. M. A.; Forgala, G. W., "Creation of an Optical XYZ Coordinate System Using Bidirectional Blazing From A Symmetric Triangular–Groove Grating in a Conical Diffraction Mount," Optics Letters, vol. 18, No. 24, Dec. 15, 1993, pp. 2162–2164, USA.

Hong, Baojin; He, Yongrong; Ye, Ronghua, "Laser Grating Interferometer Using Grating as Beam Splitter," Zhongguo Jiguang/Chinese Journal of Lasers, vol. A20, No. 1, 1993, pp. 34–37, China.

Kawatsuki, N.; Uetsuki, M., "Crossed Grating Beam Splitter for Magnetooptical Pickup Head," Japanese Journal of Applied Physics Part 1—Regular Papers Short Notes & Review Papers, vol. 29, No. 11, Nov. 1990, pp. 2420–2423, Japan.

Lehureau, J. C.; Beguin, J. Y.; Colineau, J., "Polarizing Grating Beamsplitter Using a Liquid Crystal Cell," Japanese Journal of Applied Physics, Supplement, vol. 28, Suppl. 28–3, 1989, pp. 201–203, Japan.

Hansen, J. P., Strong, J., "Performance of a Simple Spherical Lamellar Grating Beamsplitter by Wavefront Division," Aspen International Conference on Fourier Spectroscopy, Air Force Cambridge Res. Labs. 1971, pp. 215–220, Bedford, MA.

Pallister, D. M.; Lui, K–L; Govil, A.; Morris, M. D.; Owen, H.; Harrison, T. R., "Raman Microprobe with Holographic Beamsplitter for Low–Frequency Operation," Applied Spectroscopy, vol. 46, No. 10, Oct. 1992, pp. 1469–1473, USA.

Courjon, D; Bulabois, J., "Noncoherent Microholography Using a Holographic Optical Element As A Beamsplitter," Optical Engineering, vol. 20, No. 2, Mar.–Apr. 1981, pp. 233–235, USA.

Spornik, N. M.; Tuev, A. F., "Universal Interferometer with the Reference Wave Formed From the Object Wave," Optiko–Mekhanicheskaya Promyshlennost, vol. 59, No. 9, Sep. 1992, pp. 53–56, Russia.

Mikes, T., "Fringe Benefits: Applications of Holographic Elements," Photronics Spectra, vol. 17, No. 3, Mar. 1983, pp. 40–44, USA.

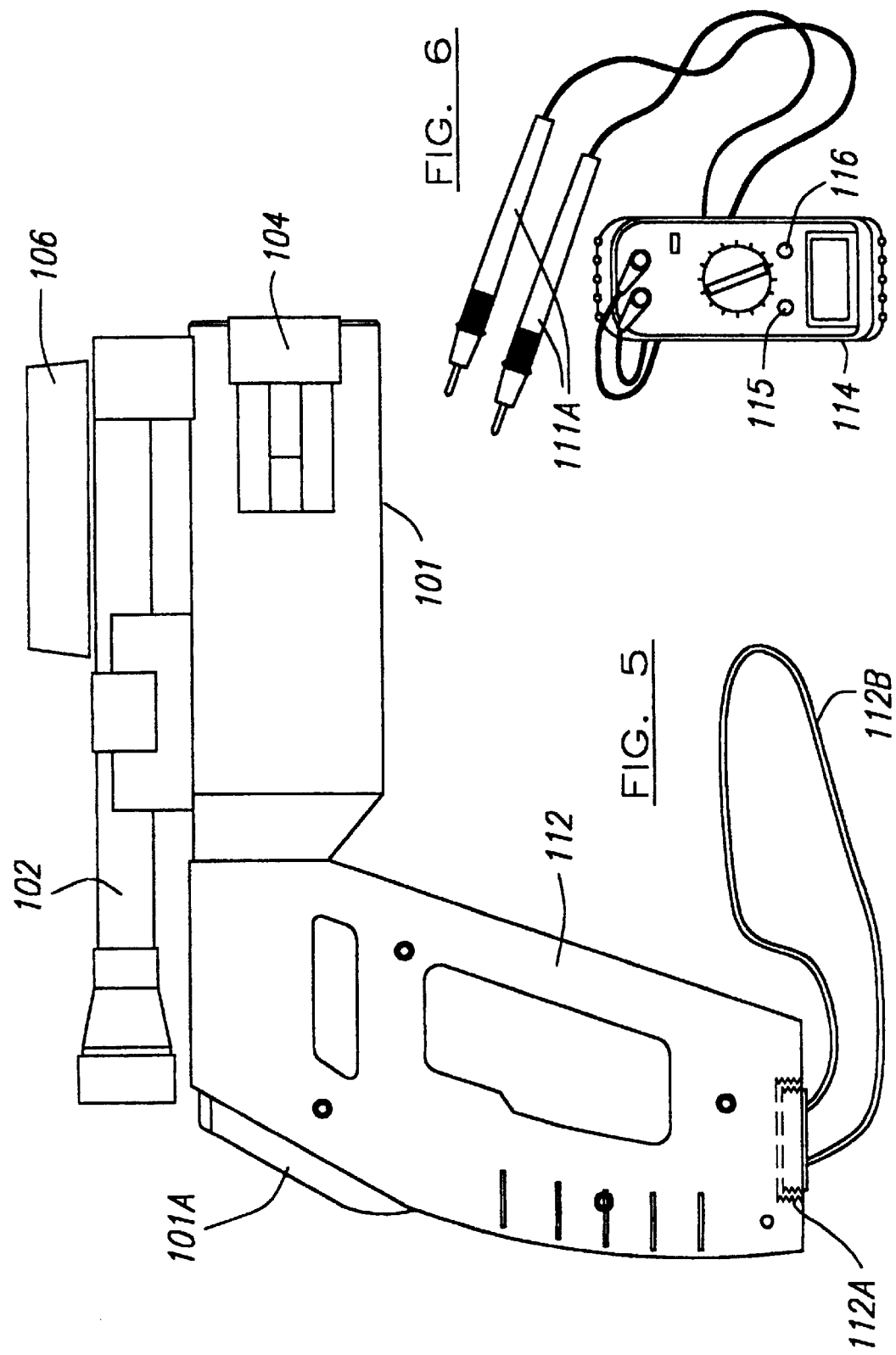

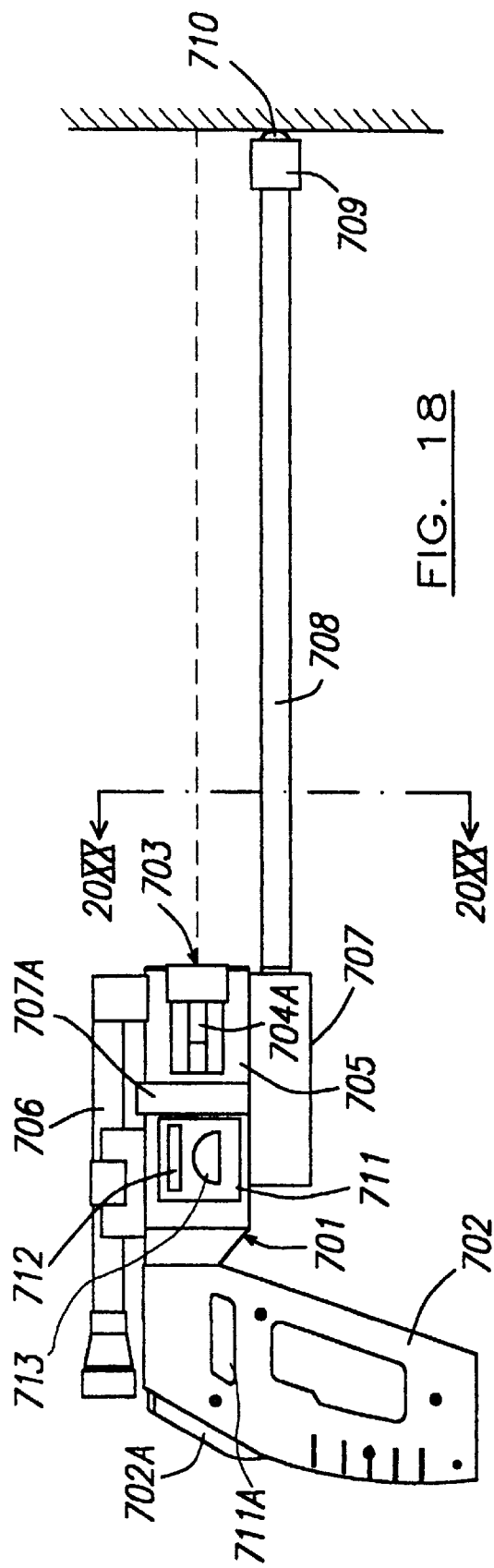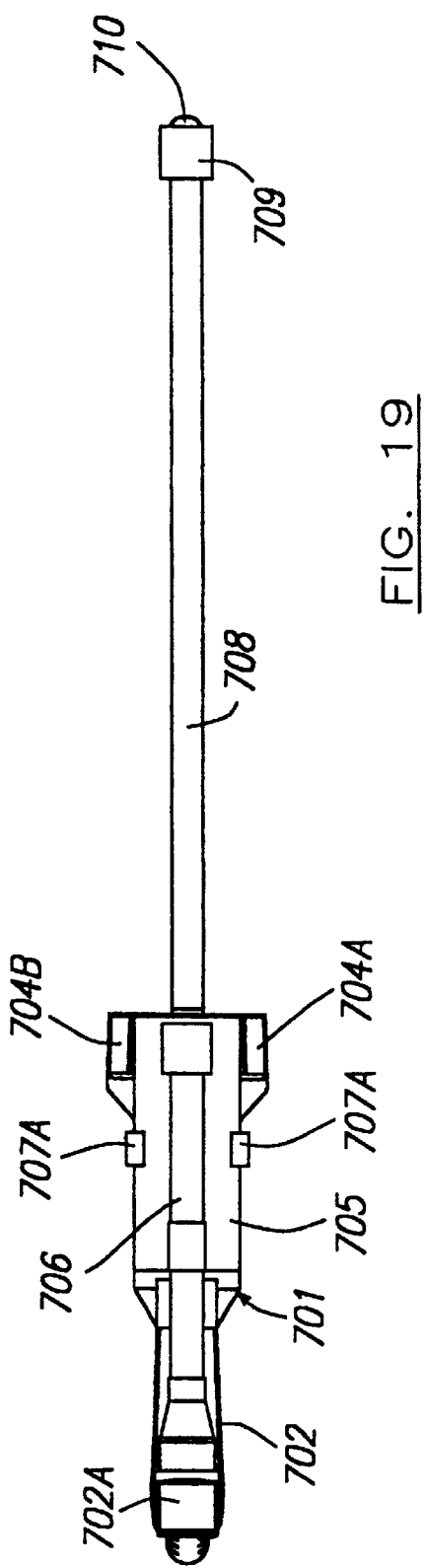

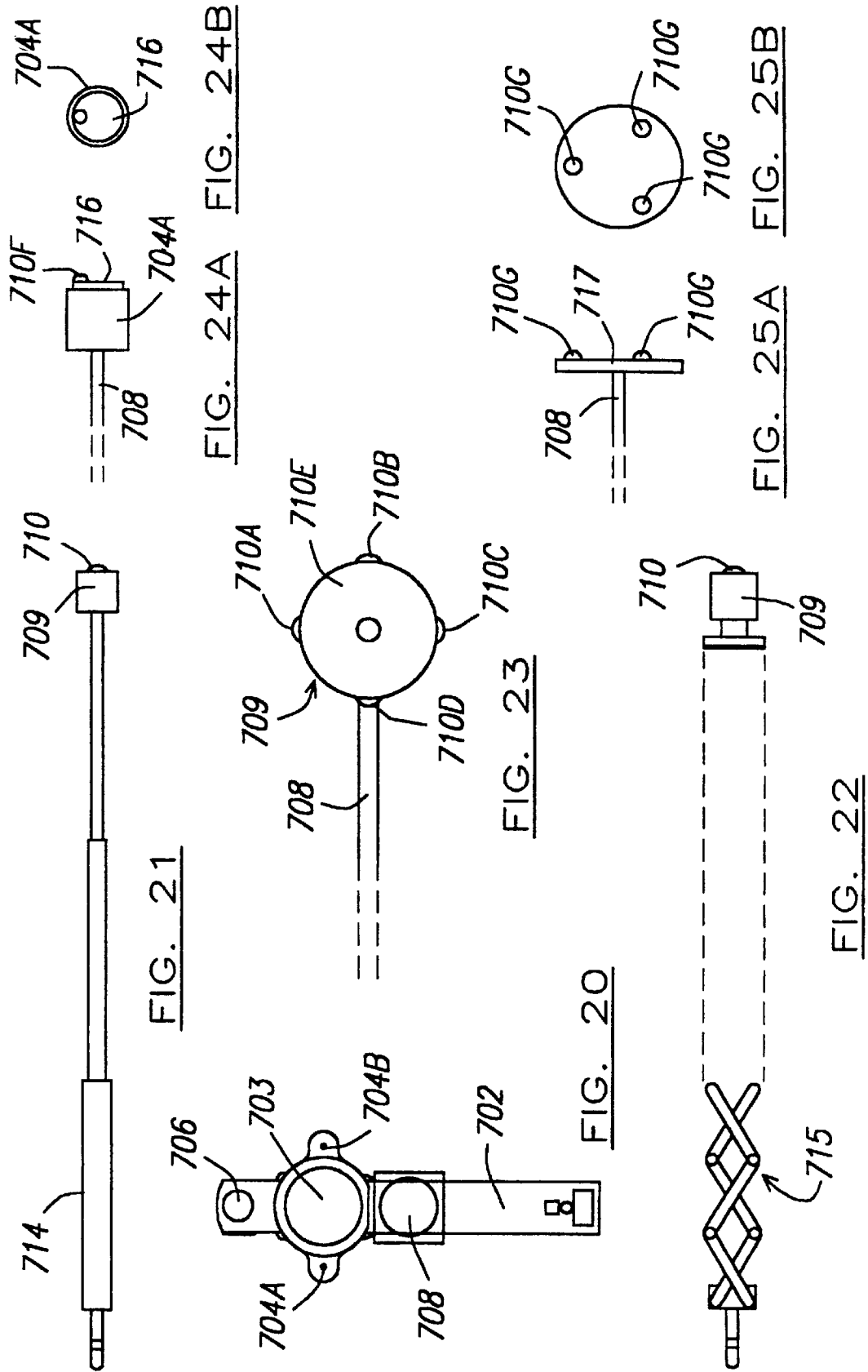

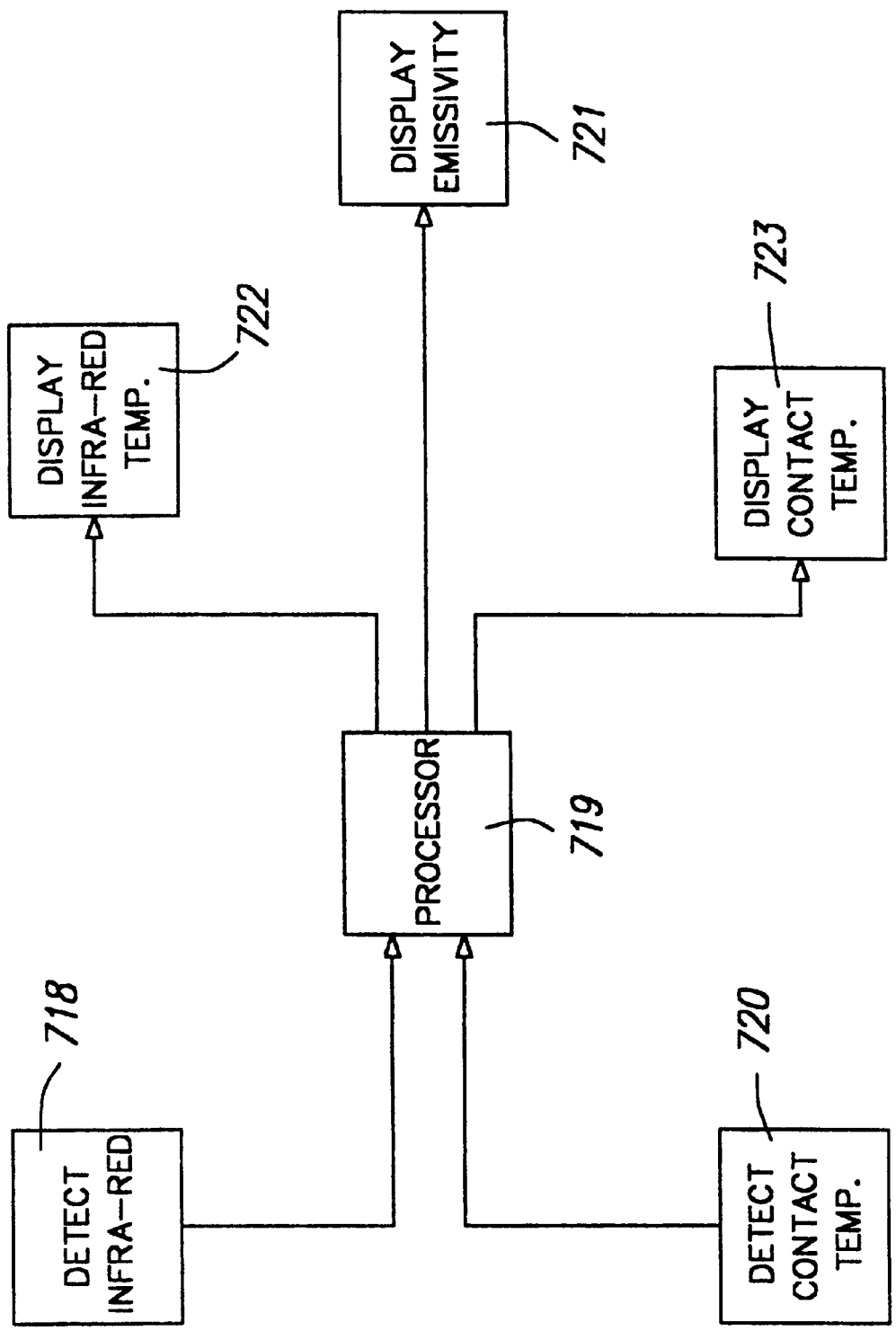

PYROMETER MULTIMETER

This application claims benefit of Provisional Application Ser. No. 60/066,315 filed Nov. 21, 1997, provision of Ser. No. 60/066,803 filed Nov. 26, 1997, provision of Ser. No. 60/077,896 filed Mar. 13, 1998, provision of Ser. No. 60/085,633 filed May 15, 1998 and provision of Ser. No. 60/094,081 filed Jul. 24, 1998.

FIELD OF THE INVENTION

The present invention relates generally to hand held apparatus for measuring the temperature of a surface using infra-red measurement techniques, and more particularly to such apparatus which utilises a laser sighting device which is adapted to project laser sighting beams onto a target for defining on the target an energy zone thereof, the temperature of which is to be measured. The invention relates further to multimeters adapted to provide a facility for measuring and indicating such factors as current, voltage, resistance, and capacitance.

It is known, for example, to measure the temperature of a target by utilisation of an infra-red detector, which is held at a distance from the target. It is also known to utilise information derived from such an infrared detector, and to combine that information with other information derived from a thermocouple device which is placed in direct contact with the target, whereby an accurate resultant temperature, and also the emissivity of the target can be calculated. The present invention is not restricted to such temperature measurements, but can serve for remote detection and for combined remote and contact detection, of other parameters besides temperature, and especially for such detection and measurement of light, sound and radiation.

OBJECTS OF THE INVENTION

It is the primary object of one aspect of the present invention to provide as a combination, in a single hand held instrument, a multimeter and an instrument having a first apparatus for determining temperature of a surface by direct contact and a second apparatus for determining radiation from the surface by a non-contact measurement.

Another object of the invention is to provide a method and apparatus, for detected measuring and displaying emissivity of a target, derived from measurements of temperature by infra-red emission and by thermocouple contact, wherein the means for obtaining both such measurements are detected and displayed as a known relationship in a single instrument convenient for displayed hand-held operation, in one hand.

It is another object of the invention to provide such apparatus wherein the infrared measurement means and the thermocouple measurement means are detachably securable one on the other, for example for individual separate use and/or for permitting simpler storage and packing when not in use. It is a further object of the invention to provide such a method and apparatus wherein readings of emissivity, infrared detected temperature and thermocouple direct contact temperature may be shown on a same or on respective displays on the same device which may include a data logger.

It is a yet further object of this invention to provide an apparatus as set forth above, which has connector means such as sockets or threaded connectors for leads, for the temporary connection of other measurement apparatus such as a thermocouple for placing in direct contact with a target.

It is a still further object of this invention to provide such an apparatus, which provides an output indication of a desired parameter in a desired range form, e.g. degrees Centigrade or degrees Fahrenheit.

It is a further object of the present invention to provide a method, and apparatus for carrying out that method, for the remote detection of a parameter, such as temperature, light, sound and radiation and for the provision of an audible output corresponding to the degree of the parameter being measured, or a warning when a pre-set limit is exceeded.

It is a still further object of the present invention to provide a method, and apparatus for carrying out that method, for the remote-detection of a first factor of a parameter appertaining to a target, and for the contact-detection of a second factor of a parameter appertaining to the target, and for the combination of those factors and the provision of an audible output corresponding to the resultant of factors.

It is a still further object of the present invention to provide such methods and apparatus wherein the audible output is delivered in the form of speech corresponding to the degree of the parameter, or of the resultant, as the case may be.

It is a still further object of the invention to provide such apparatus with remote control, especially for taking measurements of a parameter in hazardous conditions.

It is still a further object of the invention to provide in conjunction with such apparatus audible readings of measurements in any desired language, and particularly in any selected one of a number of languages, for example by use of a speech synthesizer incorporated in the apparatus.

It is a still further object of the invention to provide an apparatus, as above set forth which is in a convenient form to be hand-held, e.g. with a pistol grip for ease of manipulation with one hand, for aiming and for switching as with the thumb.

It is a yet further object of the invention to provide an apparatus as set forth above, which has connector means such as sockets for leads, for the temporary connection, of other measurement apparatus such as a thermocouple for placing in direct contact with a target.

It is a still further object of the invention to provide such an apparatus wherein the multi-meter and/or the pyrometer are adapted to be controlled by reception of vocal commands, and to provide output readings by synthesized vocal outputs.

It is a still further object of the invention to provide such an apparatus which is at least partially protected by e.g. housed within, a resilient covering such as a rubber sleeve.

It is a further object of this invention to provide such methods and apparatus wherein the audible output is delivered in the form of speech corresponding to the degree and/or units of measurement of the parameter, or of the resultant, as the case may be, or as tones.

It is a further object of this invention to provide such apparatus with remote control by, for example, radio waves and light, especially for taking measurements of a parameter in hazardous conditions.

It is a further object of this invention to provide for display of a measured parameter, or resultant, in a data storable form, e.g. on a computer monitor a data logger or by use of a machine for preparing charts, especially in the case of the taking of sequential readings, particularly in an integral display or detection measurement device.

It is a further object of this invention to provide means for audible readings of measurements in any desired language, and particularly in any selected one of a number of languages, for example by use of a speech synthesizer incorporated in the apparatus or other sound signal, such as a tone.

It is a further object of this invention to provide an apparatus, as above set forth which is in a convenient form to be hand-held, e.g. with a pistol grip for ease of manipulation with the one hand.

According to the present invention, there is provided the combination in an instrument, of (i) a multimeter, and (ii) an instrument having a first apparatus for determining temperature of a surface as a result of measurement by direct contact with said surface and a second apparatus for determining a non-contact measurement of radiation perceived at a distance from said surface.

The non-contact apparatus may comprise optical sighting means; and the non-contact apparatus may comprise laser sighting means.

The combination may further comprise means for determining emissivity of the surface whose temperature is being determined, and means for recording data, such as, a data logger.

Means may be included for providing audio output in accordance with temperature determinations, and may include speech synthesising means.

Preferably the instrument is adapted for holding in the hand, e.g. a pistol-grip handle.

The instrument many also comprise means for attachment to a tripod. Preferably, there are provided a first display for showing temperature derived from infra-red radiation, from a surface, and a second display for showing temperature derived from contact with said surface.

The multimeter and the temperature instrument may comprise means for their control and operation by vocal command.

The multimeter and the temperature instrument are conveniently detachably securable one on the other.

BRIEF DESCRIPTION OF THE DRAWINGS

The foregoing and still other objects and advantages of the present invention will be apparent from the detailed explanation of the preferred embodiments of the invention in connection with the accompanying drawings, wherein:

FIG. 5 is a side elevation of the combined pyrometer and multimeter.

FIG. 6 shows another embodiment.

FIG. 18 is a side elevation of an entire temperature and emissivity measuring device incorporating an infra-red temperature detector and a clip-on detachable thermocouple contact temperature detector.

FIG. 19 is a plan view of the device of FIG. 18.

FIG. 20 is a partial front elevation of the device of FIG. 18, taken on the line XX—XX in FIG. 18.

FIG. 21 is a side elevation of a telescopically adjustable and/or slidable detector arm, which in another embodiment replaces the arm of FIG. 18.

FIG. 22 is a side elevation of another form of longitudinally adjustable detector arm, which in another embodiment replaces the arm of FIG. 18.

FIG. 23 is a side elevation of a detector head which is rotatable in the manner of a turret to pemit bringing into use of contact temperature measuring elements of different range and/or sensitivity, when mounted at the end of a detector arm.

FIGS. 24A and 24B are respectively a side elevation and a front elevation of another form of detector head having a rotatable cover permitting the selection and bringing into use of a selected one of a number of contact temperature measuring elements of different range and/or sensitivity.

FIGS. 25A and 25B are respectively a partial side elevation and a front elevation of a detector arm having a head with multiple temperature measuring elements for triangulation of contact points about a centre.

FIG. 26 is a block diagram to illustrate a method of operation of the apparatus for measuring and displaying a desired selection of infrared detected temperature, thermocouple detected contact temperature, and emissivity calculated from both of the foregoing.

DESCRIPTION OF THE PREFERRED EMBODIMENTS

Figure 1:
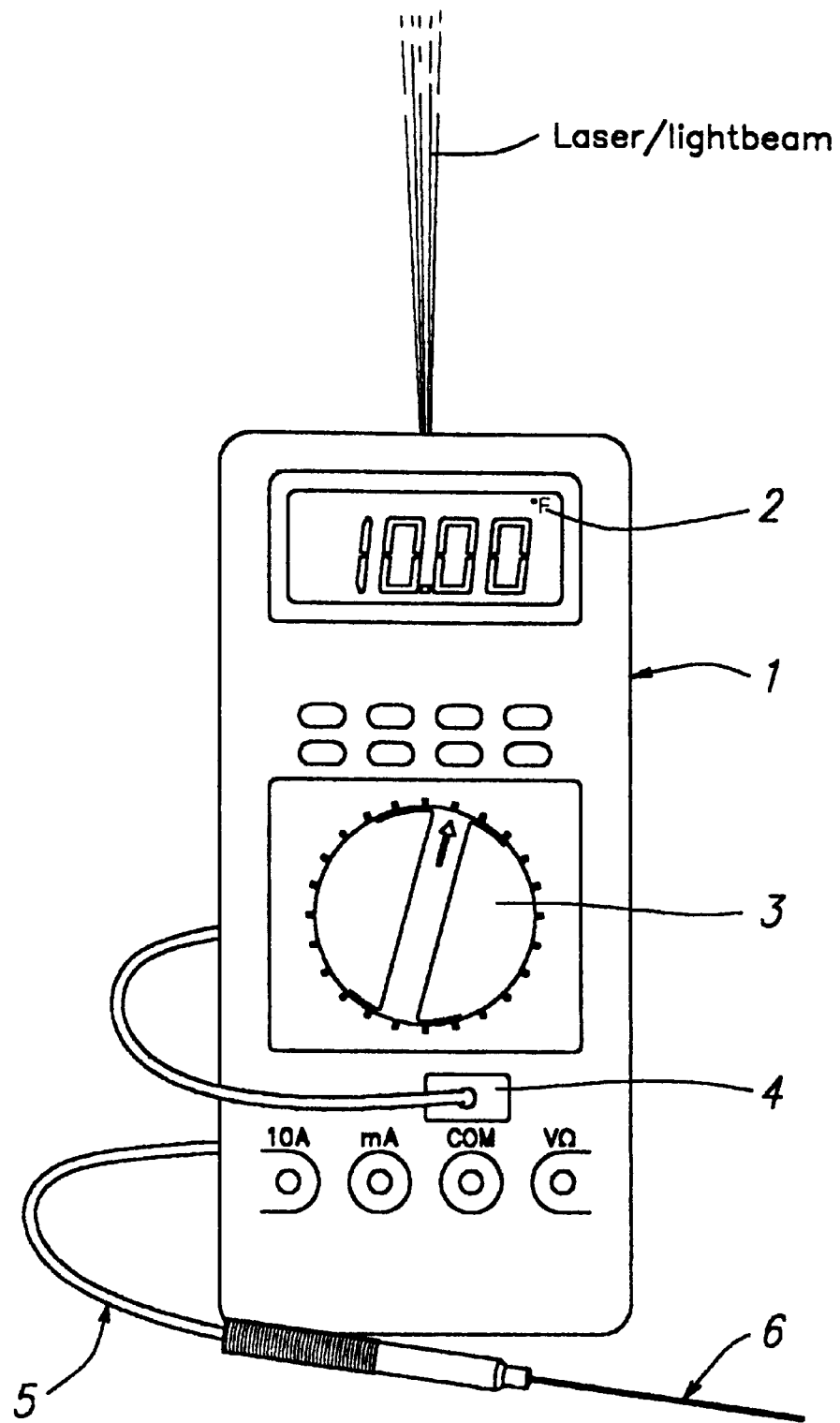
FIG. 1 is an elevation of a multi-meter which has, additionally, provision for measuring temperature at a distance, and other options.

FIGS. 1, 2A, 2B, 2C and 2D show a multimeter 1, which has a large LCD digital read-out 2, and a selector switch 3. In all embodiments disclosed herein, selector switches may be substituted by key-pads. Additionally there is provided a socket to receive a detachable plug 4 on a lead 5 having at its free end a thermocouple or thermistor probe 6 for taking temperature by direct contact. At one end there is a projector producing a laser sighting beam, which provides a 12-point laser circle (or a pattern of one or more spots or a cross or a dot and a circle for example by use of a beamsplitter) on a surface where temperature is to be measured. At the same end there is provided a built-in infra-red sensor for non-contact temperature measurement. Emissivity for the infra-red measurement is adjustable from 0.1 to 1.0.

In a further embodiment trigger operation is used for all switching and selection functions. The multimeter features minimum, maximum and average readings, and also measures voltage, current, resistance, capacitance, inductance and frequency, and has diode and logic test capability. It may also include means, such as a data logger to record values such as time, date and location. In instances in this specification where mention is made of recording of data, it is envisaged that a data logger may be used. Means (not shown) may be included for remote actuation of any of the controls.

Figure 2A:
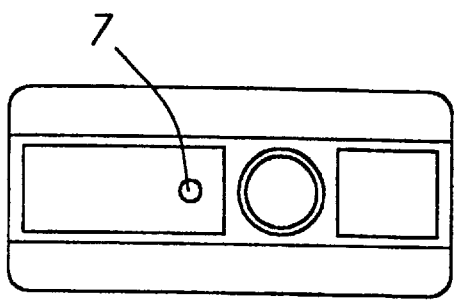
FIGS. 2A, 2B, 2C and 2D show details appertaining to FIG. 1.
Figure 2B:
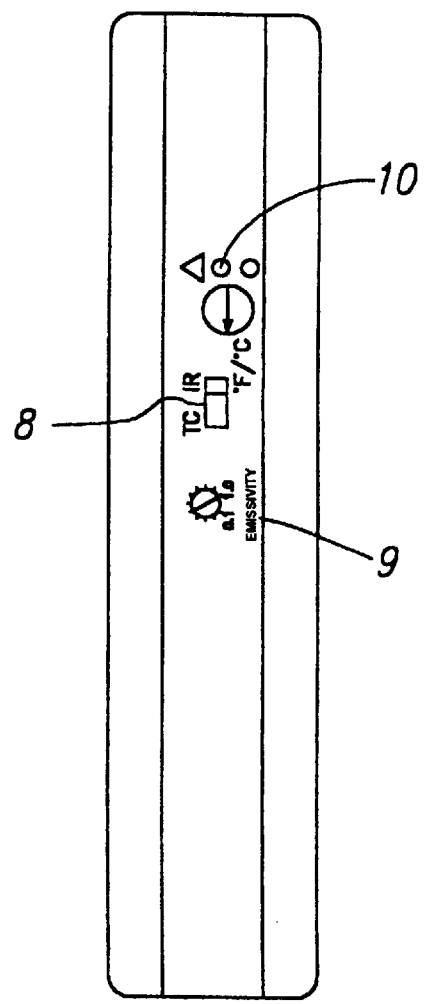
Figure 2D:
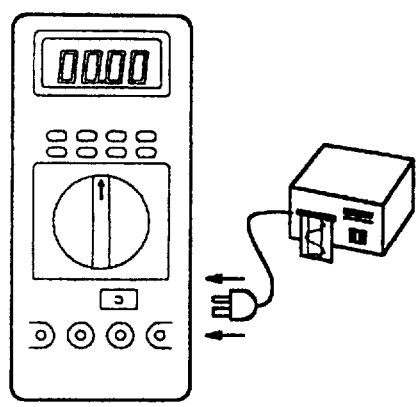
Figure 2C:
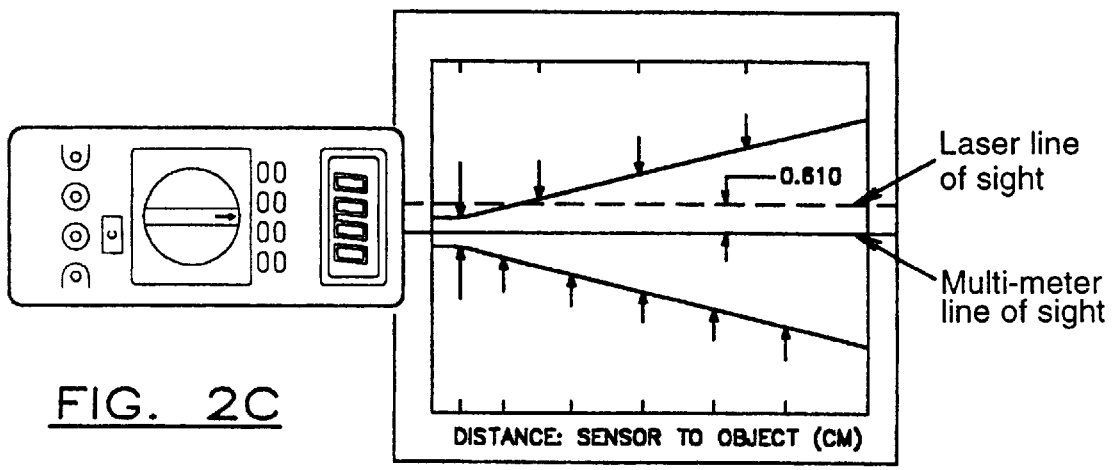

FIG. 2A is an end view to show a laser beam aperture 7. FIG. 2B is a side elevation to show a slide switch 8 for selecting thermocouple and infra-red, a control 9 for variation of the emissivity factor, and a switch 10 for momentary laser operation. FIG. 2C is a plan view to show offset of the lines of sight and the field of view. FIG. 2D shows connection to a strip chart recorder.

Figure 3:
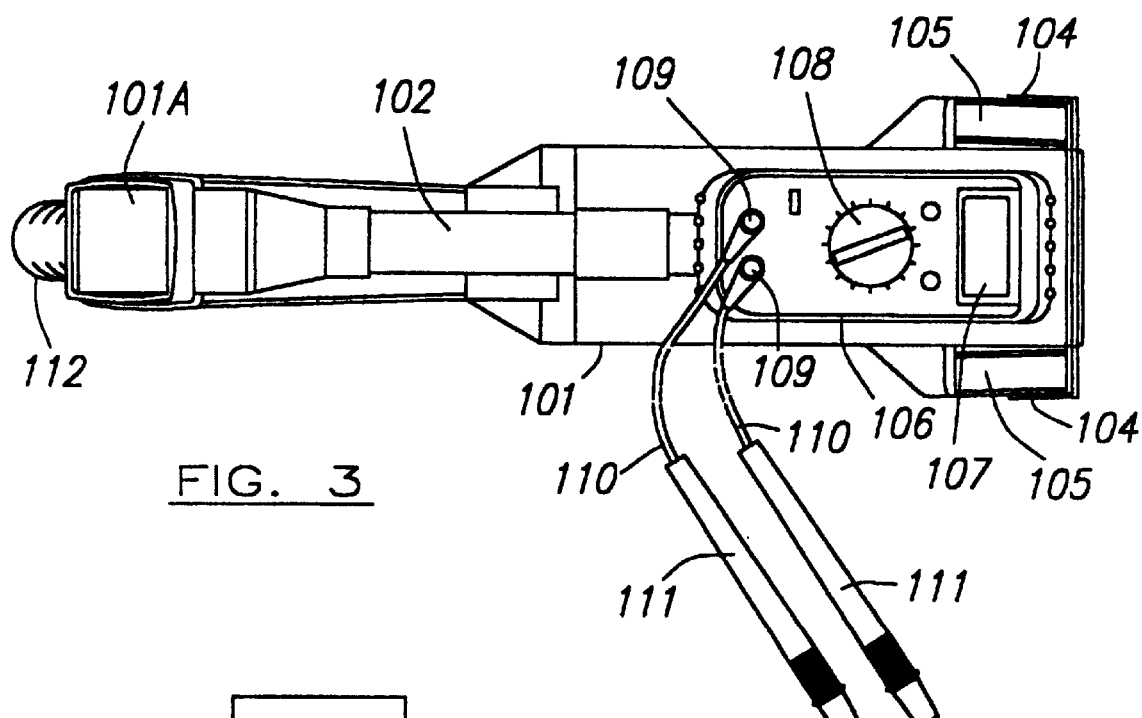
FIG. 3 is a plan view of an embodiment of a combined pyrometer and multimeter.
Figure 4:
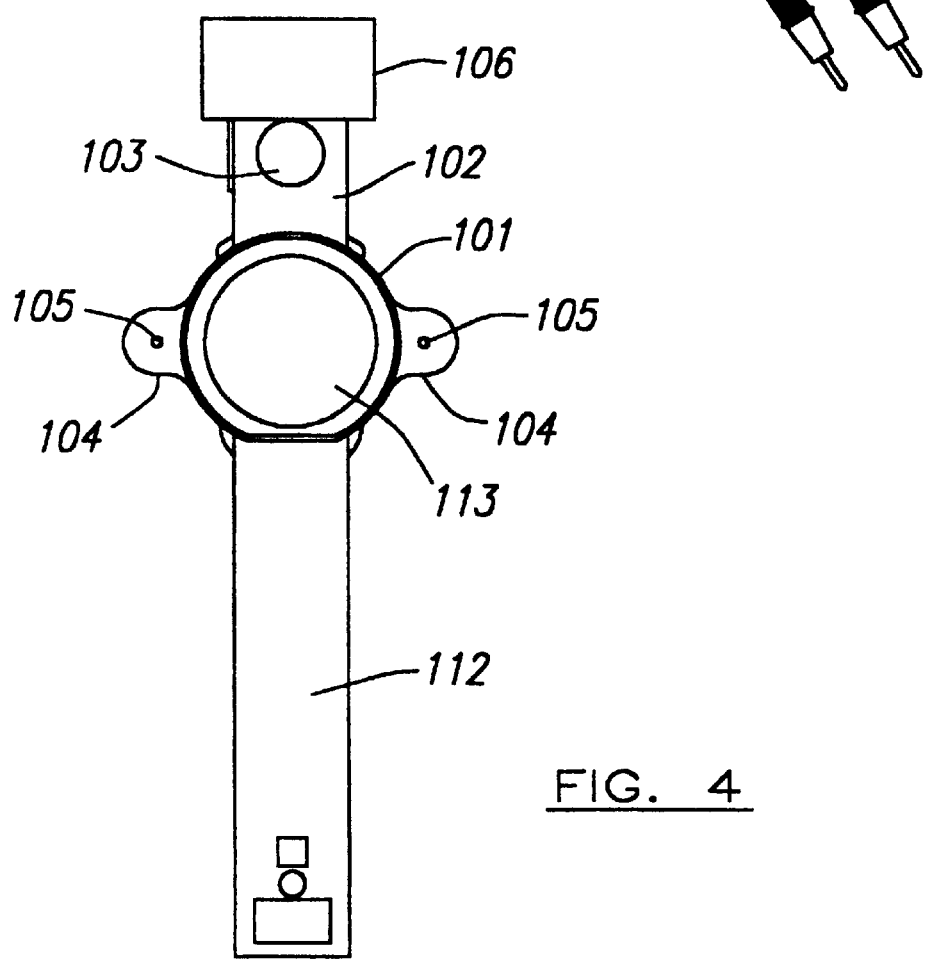
FIG. 4 is a front elevation of the combined pyrometer and multimeter.

FIGS. 3, 4 and 5 illustrate a version of a combined pyrometer, with laser sighting device, and multimeter. A conventional pyrometer 101 is provided. It includes a telescope aiming sight 102 having a lens 103. This aiming sight permits the user to aim the pyrometer towards a target. Two laser sighting devices 104 are provided on opposite sides of the pyrometer 101. The sighting devices 104 each include a laser beam projecting means 105 and these are positioned approximately 180 apart and are adapted to project a pair of laser beams (not shown) towards the target on each side of the energy zone to be measured by the pyrometer. In this manner the laser beams are used to define, for example the outer periphery of the energy zone of the target to be measured by the pyrometer. The laser beam projecting means 105 may be pulsed on and off in a synchronised manner, which may result in an increase of the efficiency of the respective lasers which, in turn, allows for an increase of the power efficiency of the instrument and better recognition of the laser beam projection.

Mounted on top of the telescope aiming sight 102 there is provided a multimeter housing 106 having, for example, a reading dial 107, a selector switch 108 for selecting a factor to be measured, and a pair of sockets to receive individual removable plugs 109 on the end of respective leads 110 for conventional probes 111.

The combined pyrometer and multimeter is carried on a detachable pistol-type grip 112 for convenience of handling and aiming. At the lower end the grip 112 has a threaded socket 112A receiving a threaded plug for a wrist strap 112B or to receive a threaded stem of the upper end of a tripod.

In these figures, the multimeter housing 106 is shown as positioned on the aiming sight 102, and in one embodiment such mounting is permanent (but dismantleable if needed), or in another embodiment is by, for example, the provision of suitable spring or other clips or toggles on the aiming sight, or on the multimeter housing, or both, or, again in a further embodiment, the multimeter housing 106 carries at its underside plugs, (or sockets) for cooperating with sockets (or plugs) on the aiming sight, so that the multimeter may, if desired, be readily removed for use elsewhere, and then replaced when necessary.

Within the pyrometer 101 there is provided at its front end (on the right hand side in FIGS. 3 and 5) a conventional pyrometer assembly (not shown) which receives through a front lens 113 the heat rays which are emitted from the selected area of the target which has been defined by the laser beams from the sighting device 104. A switch 101A is provided on the grip 112.

The arrangement is such that the output readings of the pyrometer are presented on the reading dial 107 of the multimeter, e.g. by arranging that a respective selected position of the selector switch 108 is allotted to the output of the pyrometer.

In an alternative arrangement, not illustrated, the pyrometer 101 itself has a pair of output leads plugged into respective sockets on the multimeter housing 106.

In a preferred form, the multimeter 106 is arranged to be operable alternatively, or additionally, in such a manner that it will receive vocal commands for its various operations such as selection of a range to be read, and such that it will also give out, in synthesized speech, the factor which is being measured and indicated as a reading.

Trigger operation may be provided. A meter system includes provision for vocal inputting of instructions, data and information and also vocal outputting of information and data.

Mention of prior art hand-held multi-meters which detect and display data and also deliver vocal reports are disclosed in:

a) HOLLANDER—U.S. Pat. No. 4,949,274 Aug. 14, 1990
 b) TACHIMOTO ET AL—U.S. Pat. No. 4,864,226 Sep. 5, 1989
 c) WAGNER W. S. 'Talking meter', *ELECTRONICS* Dec. 20 1979, Page 123.

The contents of all of the above-mentioned items are fully included herein by reference.

FIG. 6 shows another embodiment of a multimeter for association with heat measurement devices. As distinct from the multimeter shown in FIGS. 3–5, the multimeter 114 has, apart from the probes 111a, a further pair of ports 115, 116 which receive plug connectors for (i) a thermocouple heat-measurement device, and (ii) an infra-red heat measurement device, both of which items are well known in the field of measuring instruments and need not be illustrated here. For example, the first port 115 receives a connector of a thermocouple device, and the second port 116 receives a connector of an infra-red measurement device, for example the pistol-grip device of FIGS. 3–5.

In FIGS. 3–5, the infra-red measurement device is shown as a relatively large structure on which a relatively small multimeter is carried. These roles are reversed in further embodiments, in that the multimeter, made relatively larger, itself carries an infra-red measurement device on it, permanently or removably attached. The internal construction of the multimeter is such that the resultants of the respective measurements made by the thermocouple device and by the infra-red measurement device are read adjacent to each other in a same meter aperture, whether by simple needle-dial arrangement or by electronic display, for ease of changing ranges.

The thermocouple measuring device is used to take a direct surface contact temperature measurement from an object to be investigated, and the infrared measuring device is used to provide a reading of surface temperature of the object by the infra-red radiation from a selected target area. As a result of having both of these readings available on the same meter it is possible, by a known mathematical calculation to arrive at the emissivity of the object being investigated. It is known that there is a company FLUKE, of Washington State, USA which manufactures a multimeter having a thermocouple incorporated on the meter. It is also known that there is a company RAYTEK, of California, USA, which manufactures pyrometers, which can be plugged into a FLUKE multimeter. However, there has not been any previous proposal to provide facilities for both a thermocouple output reading and an infra-red pyrometer output reading to be presented simultaneously on a same meter for comparison to provide an indication, after calculation, of emissivity of the object under investigation. Further, the multimeter of this invention in a further embodiment includes electronic circuitry, e.g. a microchip, to carry out the necessary conversion of the two outputs to a reading of emissivity and/or to display temperature effectively in Centigrade or Fahrenheit units.

In a still further embodiment, the multimeter 116 is provided with all or a selection of the usual output readings for multimeters, e.g. voltage, current, resistance, capacity etc. and sub-divisions as necessary.

The combined pyrometer and multimeter is intended for use as a convenient portable hand-held device to facilitate its use in the field. To guard against inadvertent damage when in use or when being transported, all or part of the combined device, is, in a further embodiments, protected by or housed within a resilient sleeve.

Figure 7:
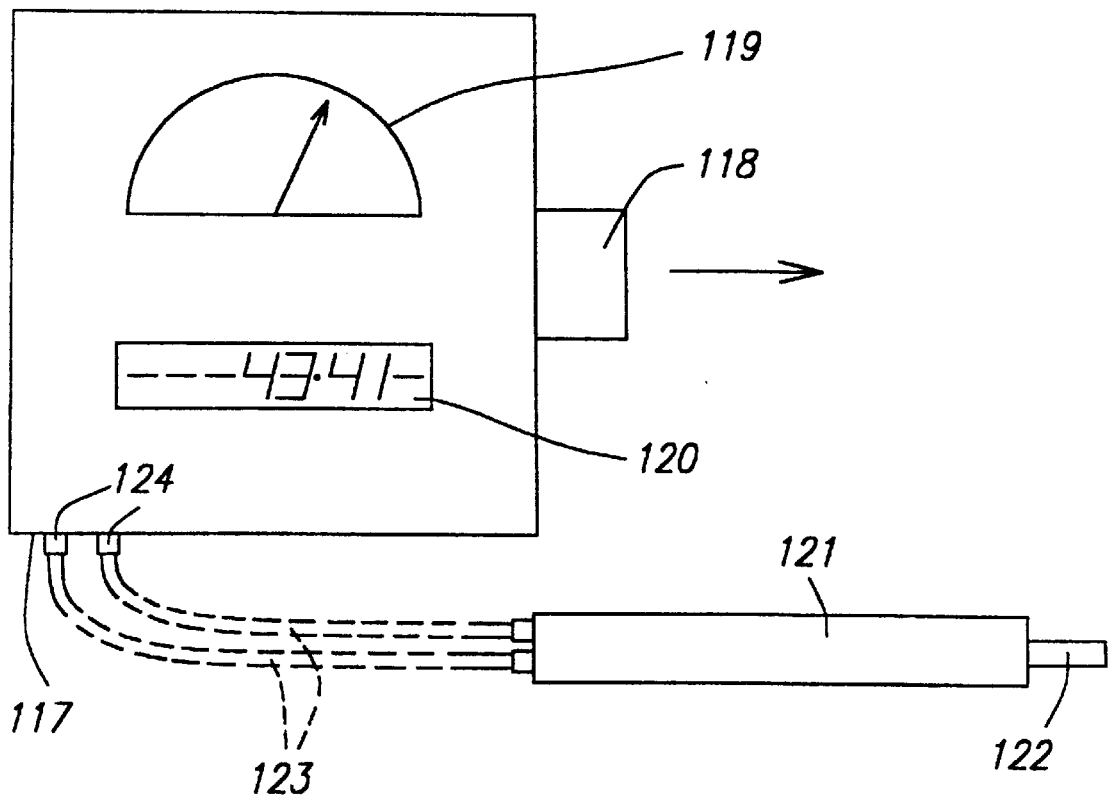
FIG. 7 shows a system incorporating an infra-red heat measurement device and a thermocouple temperature measurement device, which are directly connectable for simultaneous showing of infra-red emission and contact temperature.

Referring to FIG. 7 there is shown a system which incorporates two measurement devices arranged to be connected so as to show direct comparison between infra-red rays emitted and temperature as detected by a thermocouple.

In this figure an infra-red emission detector 117 is shown in schematic form, for simplicity of understanding, but in practice it would include means for identifying a target area of a body whose heat emission is to be tested, plus means for receiving infrared rays from the selected target area of that body and displaying a reading which corresponds to the emission received. Thus the identifying means and the emission receiving means are shown at 118, for direction at the target area in the direction of the arrow. The reading of the emission received is arranged to be shown on an analog display, such as the meter 119 and/or also as digital reading at the window 120.

The second measurement device is a thermocouple instrument 121, with probe 122, which is connected by the usual two leads 123 to plugs 124 which can be plugged into the detector 117, so that the output reading of the thermocouple can also be read on the meter 119 and on the digital window 120.

In this manner there can be obtained a direct comparison of the two outputs. The detector body 117 in a further embodiment includes circuitry for providing, on the meter 119, or on the window display 120, or on a still further output display (not shown), a reading of emissivity derived from the two detection systems. Optionally, the detector 117 is included in a multimeter device.

Instead of or as well as the connection of the thermocouple instrument 121 to the infra-red detector, or multimeter as the case may be, by plug-in leads 123, there is in a further embodiment any convenient known form of 'wireless' connection, e.g. by radio signal or infrared ray signal.

In the construction and use of apparatus for the detection and measurement of heat emission from a body, it is desirable to identify a 'target' area of the body, and to detect the heat emission from that target area. The identification can be carried out by, for example, outlining the target area with a plurality of laser beams issuing from a laser system on the infrared detection means, either by a continuous outline or by circumferentially or otherwise spaced points illuminated by laser light, and further pinpointing a centre point of the target area. Obtaining of a plurality of laser beams for these purpose is, in a convenient embodiment, obtained by beam-splitter means such as diffraction means.

Referring to FIG. 7 of the drawings and the associated description it is convenient in practice to be able to change easily and rapidly from providing a reading by the infrared radiometer to a reading by the thermocouple device, and vice versa. To enable this, the thermocouple device and/or the infra-red radiometer, are in a further embodiment provided with a manually-operable switching means, such as a rotary switch or a slide switch, to permit toggling between the two readings, possibly with a third condition in which readings are combined for assessment of emissivity.

Figure 8:
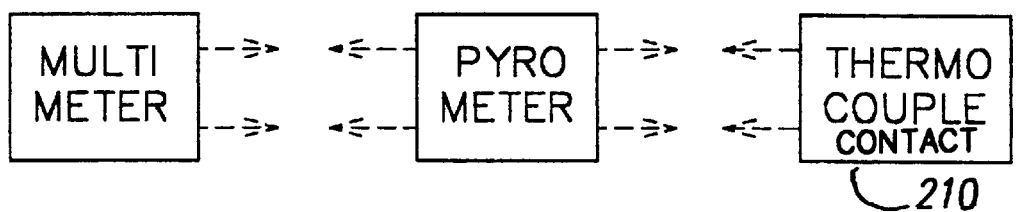
FIG. 8 is a block diagram to illustrate possible interconnections between a multi-meter, a pyrometer, and a thermocouple.

FIG. 8 shows diagrammatically possible connections between the items by cable, wireless or infrared.

In other embodiments of the constructions described, the thermocouple contact element 210 is made dismountable and replaceable by another such head having a different temperature range and/or sensitivity.

The surface thermocouple junction may be aligned to the centre of the optical field of view of the infrared thermometer, and a distance of from 6 inches up to about 24 inches from the optical lens to the surface thermocouple junction is convenient. This distance is a function of the optical field of view of the thermometer and the temperature range being measured.

When the surface probe is attached in front of the optical housing of the infra-red thermometer, and the output of the surface probe is connected to the infrared thermometer, the thermometer is then ready to measure the surface temperature of a target optically and via the surface probe.

There is an electronic function built into the apparatus to calculate the Emissivity of a target based on the optical infrared energy emitted from the target and the output of the surface probe measuring the target surface temperature.

This function determines the Emissivity of any surface at any temperature.

A prime advantage of the constriction in accordance with the invention is that the user can hold and operate it with one hand, leaving the other hand free for whatever purpose.

Figure 9:
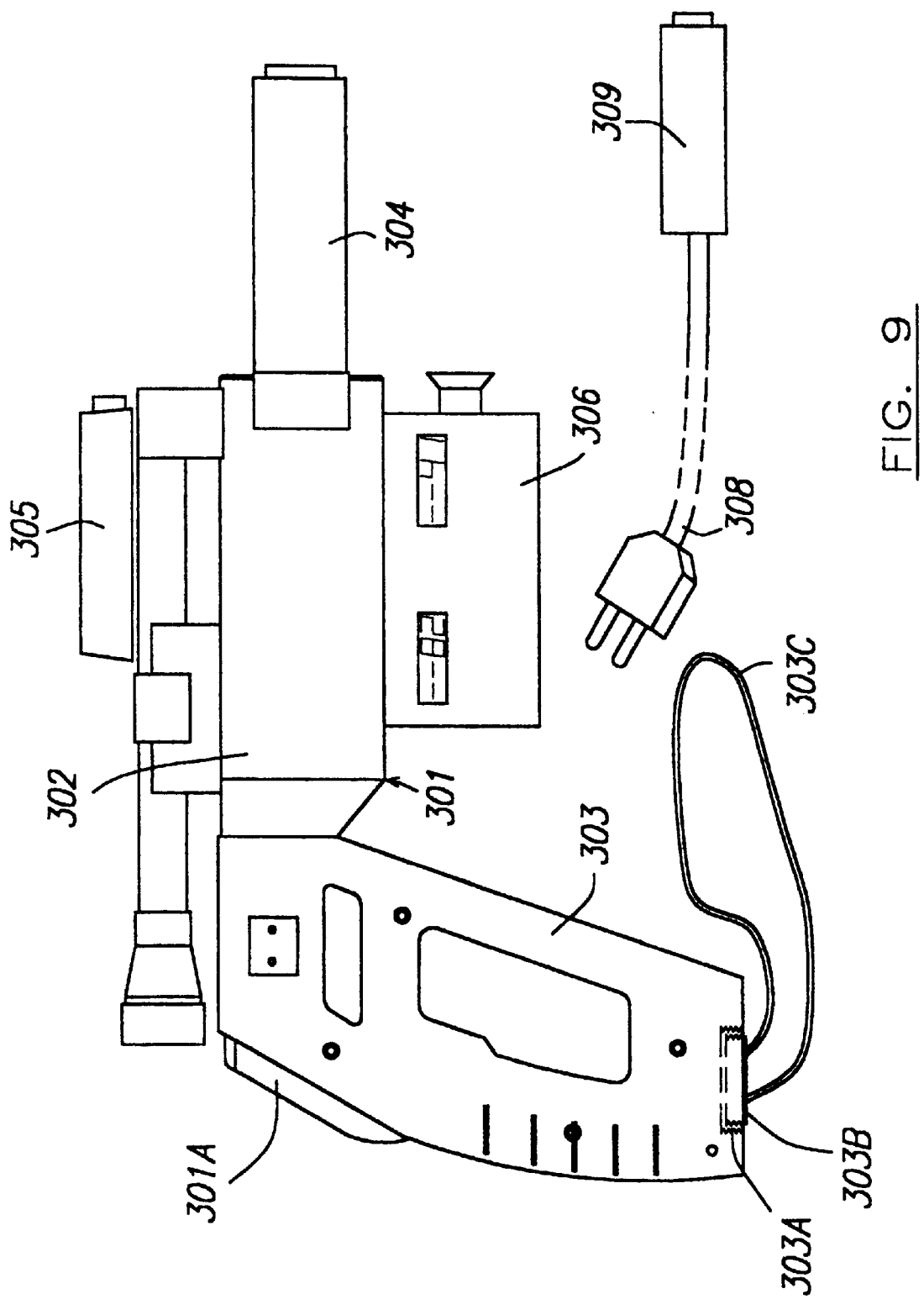
FIG. 9 is a side elevation of a measuring instrument, for the remote detection of a parameter and the delivery of an audible output corresponding to the measurement taken, which has a pistol grip to permit easy use with one hand for supporting and aiming it.

Referring to FIG. 9 there is shown a measuring instrument denoted generally by reference numeral 301, which has a body portion 302, carried on a pistol grip 303 bearing a switch 301A. At the lower end the grip 303 has a threaded socket 303A receiving threaded plug 303B for a wrist strap 303C or to receive a threaded stem of the upper end of a tripod. At the forward end of the body portion 302 there is mounted a detector head 304. In various embodiments, this detector is a remote temperature detector, a remote light intensity detector, a remote sound intensity detector, or a remote radiation detector. Other embodiments have remote detectors, for other parameters, in-built or provided as separable units which can be secured in position on the body portion 302, with appropriate connections to the internal circuitry of the body portion 302 being made at the time of mounting thereon, or, subsequently.

To assist in the accurate sighting of the detector head 304, the body portion 302 carries sighting means 305. In a different embodiment, this is a simple optical device such as cross-wires, or a telescope, or means for projecting a beam of light, such as a laser beam, or beams, onto the target area, both for centring on the target area, and for defining the extent of the target area being investigated. Different laser beams can be modified to converge into the field of view.

On the underside of the body portion 302 there is mounted a meter assembly 306 which is, in one embodiment, a simple multi-meter with selectable parameter ranges, or in another embodiment is an electronic assembly capable of carrying out conversions of parameters into selectable different ranges. In particular the meter assembly 306 incorporates means for the conversion of the parameter readings into audible forms and preferably as synthesized speech indication of the parameter reading delivered to a sound transducer or loudspeaker incorporated in it.

The body portion 302 further carries means 307, such as sockets, for the reception of leads 308 from another parameter reading instrument, such as a thermocouple device 309 used for placing in direct contact with a body whose temperature is to be measured.

In a further embodiment trigger operation is utilised.

Figure 10:
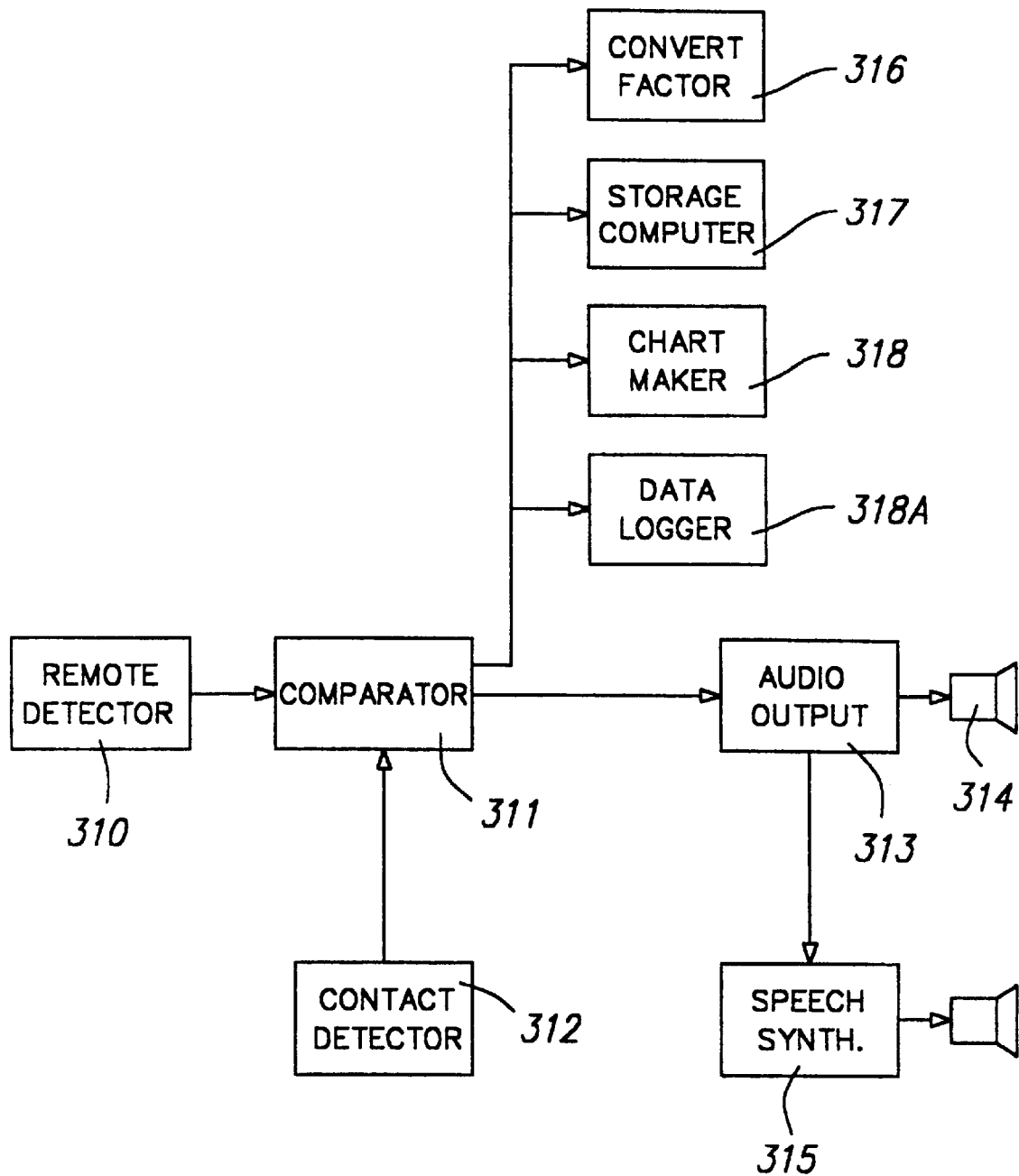
FIG. 10 is a block diagram to show both essential and optional components which can be utilised in the apparatus for the provision of an audible output corresponding to a measurement of a parameter, and for simultaneous visual presentation of the measurement, and also for storage of measurements, for example in chart form.
Figure 10B:
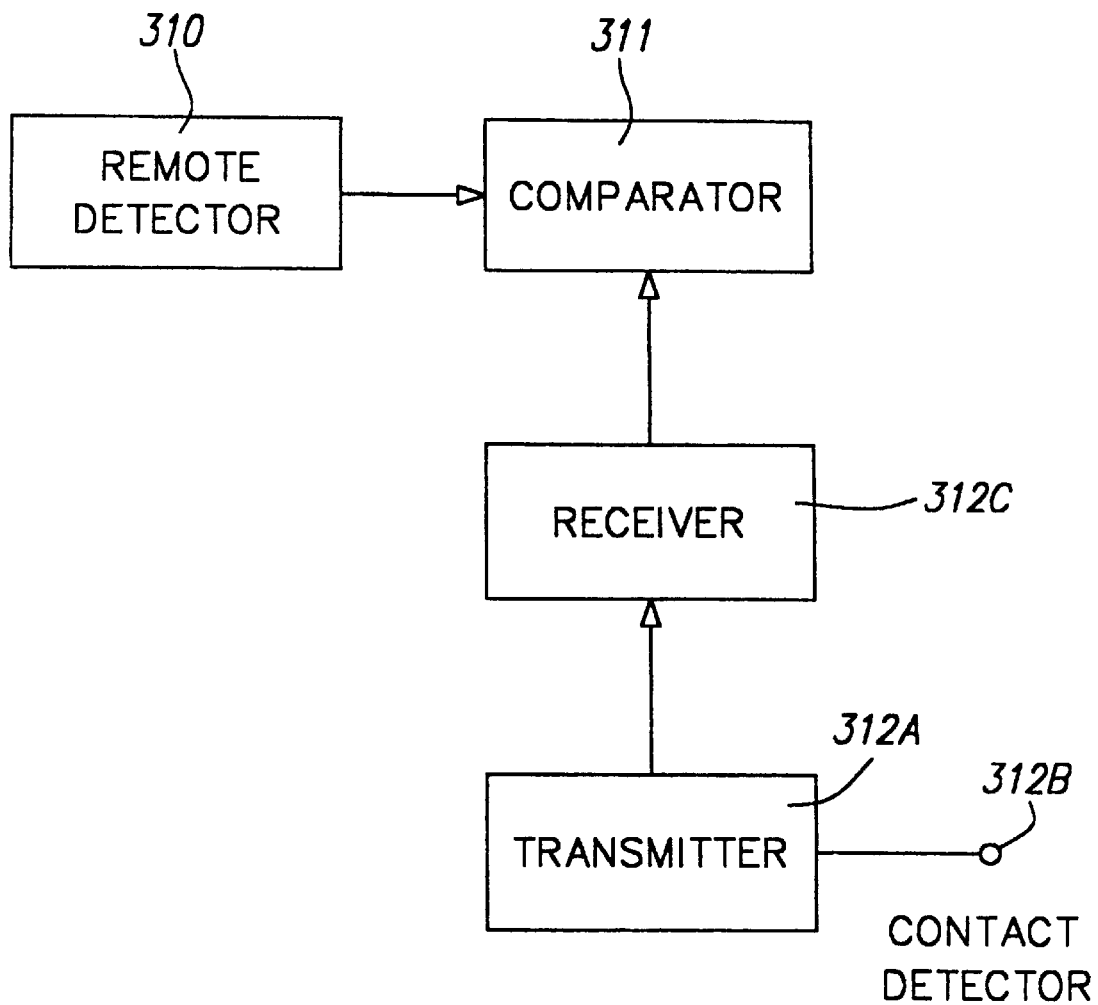
FIG. 10B shows a modification of FIG. 10.

Referring now to FIG. 10 of the drawings a remote detector 310, such as the device of FIG. 9, feeds its output to a comparator 311 which also receives another output from a direct-contact measuring device 312, such as the thermocouple described with reference to FIG. 9 or from a transmitter 312A having a contact detector 312B and feeding a receiver 312C connected to the comparator as seen in FIG. 10B. Output from the comparator 311, being a resultant of the remote and of the direct-contact measurement taken, is fed to a means 313 for the conversation of the measurement results into an audible form to be issued from a loud-speaker or other transducer 314. The audio output from the audible conversion means 313 may be fed to a speech synthesizer 315 for the provision of the measurement results in any desired audible form, e.g. a selected language.

Output from the comparator 311 is in another embodiment fed to further converter 316 which is arranged to show the measurement resultant in a selected parameter range, for example, degrees Fahrenheit or degrees Centigrade where heat measurement is being made.

Output from the comparator 311 in a still further embodiment is fed to means for electronic storage of the measurement or of a series of measurements, taken by the apparatus, for example to a computer system 317 arranged for display of the results, or a data logger.

Output from the comparator 311 may in a yet further embodiment be fed to a means 318 for the visual storage of a measurement of a series or range of measurements, e.g. a chart-making apparatus, and to a data logger 318A.

With the apparatus of the present invention, measurements taken remotely may be made at long or short separations from the target, for example at 5 inches or at 5 feet.

Figure 11:
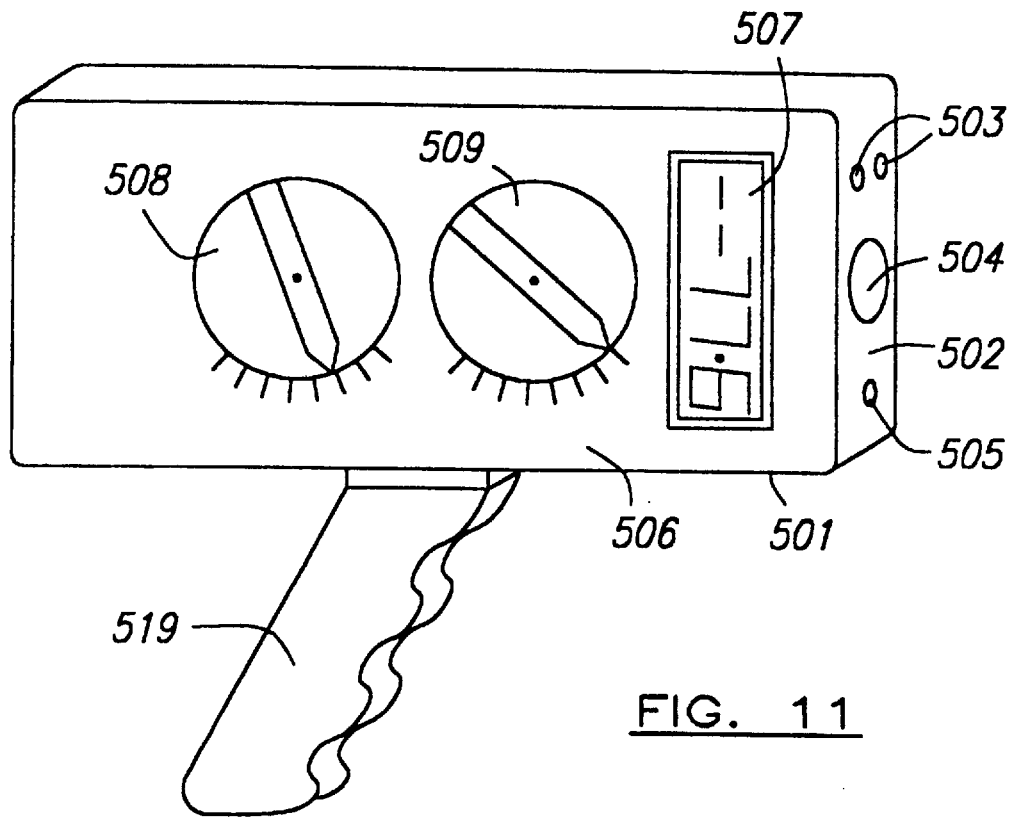
FIG. 11 is a side perspective view of an embodiment of a measuring device fitted with a removable handle for holding in the hand.
Figure 12:
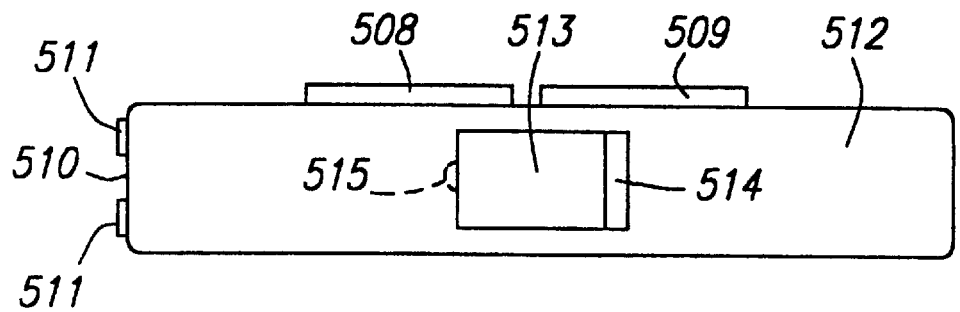
FIG. 12 is an underside view of the measuring device of FIG. 11 with the handle removed.
Figure 13:
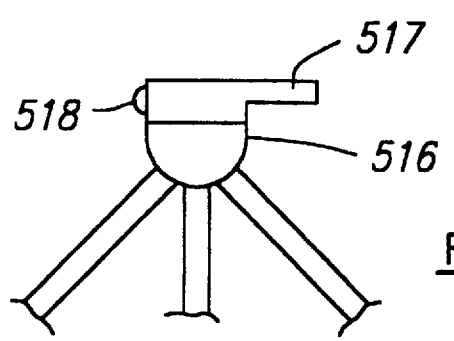
FIG. 13 is a side elevation of a tripod, which is constructed to slot or fasten into the underside of the measuring device of FIG. 11 in place of the removable handle.

Referring to FIGS. 11, 12 and 13 of the drawings, there is shown an embodiment of measuring device which is adapted to be held in the hand, or in another form, has a handle secured in position to enable the measuring device to be aimed and controlled by one hand, or again if desired is mounted detachably on a tripod to enable the device to be positioned, for example, in an environment undesirable for the user, e.g. hazardous. The handle may include a security wrist strap or lanyard to protect against dropping.

The measuring device comprises a substantially rectangular body 501 having at a front face 502 a pair of openings 503 for laser or other light beams used for both aiming and distancing the device from a target to be investigated. Also in the front face there is a lens 504 for receiving infrared radiation from a target, and a socket 506 for any one of various probes, all as described below in this specification. On a sidewall 506 there is provided a window 507 for a digital read-out display, and two rotary switch control knobs 508 and 509 or a keypad for the selection of various ranges and various parameters to be measured. Provision is made on a rear end wall 510 for sockets 511 to receive probe leads, as shown for example in FIGS. 11 and 24.

On the underside 512 there is provided a rectangular socket opening 513 in which there is a catch abutment 574 at one end, and a ball recess 515 at the opposite end.

Referring to FIG. 13 there is shown a partial side elevation of a tripod 516 which has at its upper part a mating catch member 518 which can be engaged behind the catch abutment 514, and the upper part also has a spring loaded ball catch 518 which can snap into the ball recess 517 to retain the tripod firmly in engagement with the body 501.

The pistol grip handle 519 shown in FIG. 11, which is shaped to enhance the grip of the user on it, has at its upper end (not shown) a similar mating catch member 517 and a similar spring-loaded ball catch 518, so that according to the choice of the user, both the handle and the tripod can be engaged releasably on the body 501.

It will be seen that, when the pistol grip handle 519 is secured on the body 501, the control knobs 508 and 509 are within easy reach for operation by, for example, the forefinger of the user holding the handle. Any other control features, which may be provided on the sidewall 506, are likewise within easy reach of the forefinger for manipulation.

In a further embodiment of the measuring device, (not illustrated) the socket opening 516, with its catch abutment 514 and its ball recess 515 are provided on a side wall of the body 501 instead of its base wall.

In a modification, the laser or other light beam means used for aiming are made modular and removable and exchangeable by other such aiming means. Such aiming means will be capable of being applied separately, for mounting by a user. Thus a laser projecting one spot, two spots or a ring or cross of spots may be selected or substituted.

Figure 14:
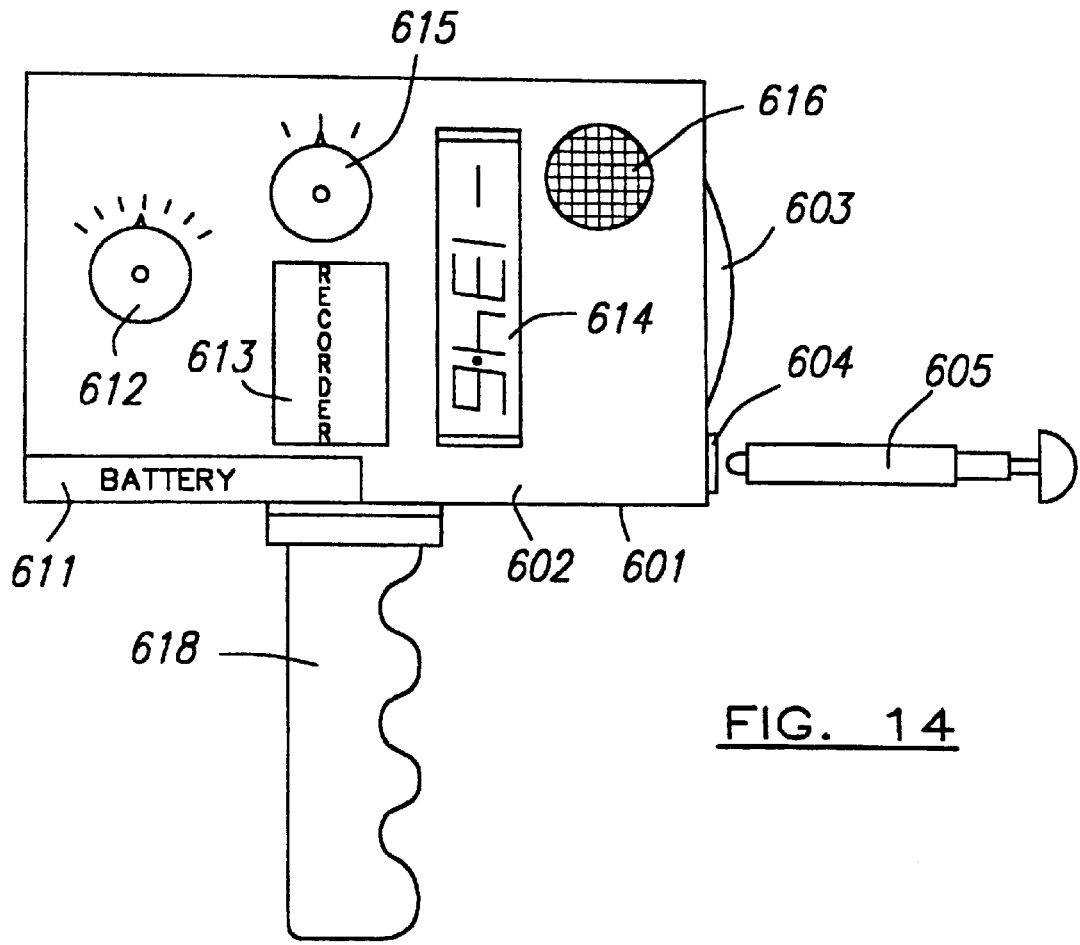
FIG. 14 is a side elevation of another embodiment of a measuring device with a removable handle for holding in the hand.

Referring to FIG. 14 a measuring instrument 601 has a rigid casing 602, of metal or plastic material, in the form of a parallelepipedal body.

At a front end of the body 602 there is a lens 603 of an internal unit for measuring temperature, at a distance from a selected area of a target by receiving infra-red radiation from that area. At the front end there is provided a socket 604 to receive a separable second unit, for example a thermocouple, for measuring temperature by direct contact with the selected area of the target, such as the telescopic probe 605, and the foldable arm 606, the resilient deformable arm 607, and wire lead or fibre optic 608, and the loop probe 609. Use of a fibre optic connection permits use in inaccessible locations without risk of inductive heating along the connection.

In another form, the separable unit is an infra-red receptor for use in locations which cannot be reached by the receptor in the body 602.

In yet another embodiment, a contact temperature device or an infrared sensing device, or both, is or are provided separate from the instrument 601, and are provided with means for transmitting measurements, e.g. by induction, radio or light signals, back to a suitable receptor on the instrument 601. The arm in another form carries an inductive loop, as in metal locators, or a unit as used in buried wiring locators.

The body 602 has a recess, or clip, (not shown), for storage of items 605 to 609 for ease of carrying. Detailed disclosure of the nature of the infrared detector system is not necessary, because such apparatus is already known. For aiming the detector system accurately at a desired small area of target, the device is provided with an internal projector (not shown) for projecting one or more respective beams of laser light, or light from another suitable source, through opening 610 to strike points or a circle, or both, on the target area. In a further embodiment the laser projector is modular and removable and can be substituted by another such projector, which may provide a different spot pattern.

The body 602 includes a compartment, covered by a removable or hinged cover 611 for batteries or a mains power adapter to power the apparatus. On one side of the body 602 there is provided a selector switch 612 for selecting the function and the range of parameter or parameters being investigated. Also with the body 602, there are provided data logger means (not shown) for making a temporary, or permanent, recording of the results obtained, such recording means being positioned within a compartment 613. On the side of the body 602 there is also provided a digital meter 614 to indicate the degree of the parameter being investigated. The meter may also display, for example, date and time and a reference. Also on the body 602 there is provided a selector control knob 615 which can be manipulated to cause the apparatus to operate for selected periods, and/or for repetition of selected periods of time, such as every hour, for example when it is desired to leave the apparatus in place for extended periods of time, for example to take and, record readings over an extended period such as a month. Also on the body 602 there is provided an audio output transducer 616, such as a sound transducer, head phone connection or loudspeaker, for enabling the apparatus to give audible outputs corresponding to the measurement being obtained, say when the apparatus is placed in a situation or an atmosphere which would be injurious to the user.

Figure 15:
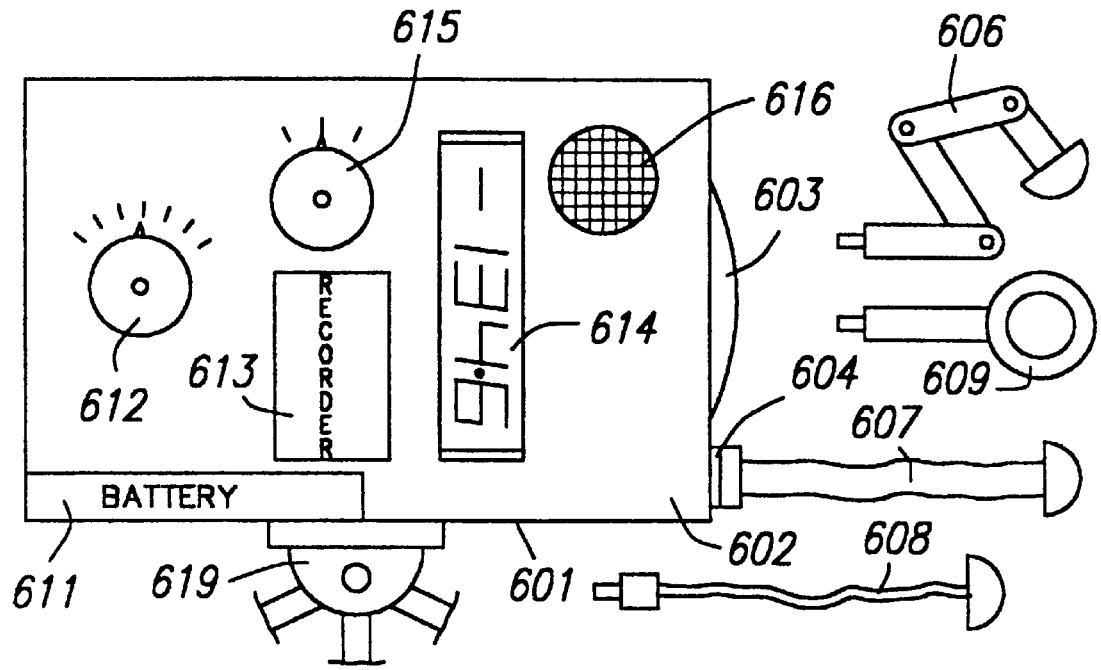
FIG. 15 is a side elevation of the measuring device of FIG. 14, which is shown mounted removably on a tripod.
Figure 17:
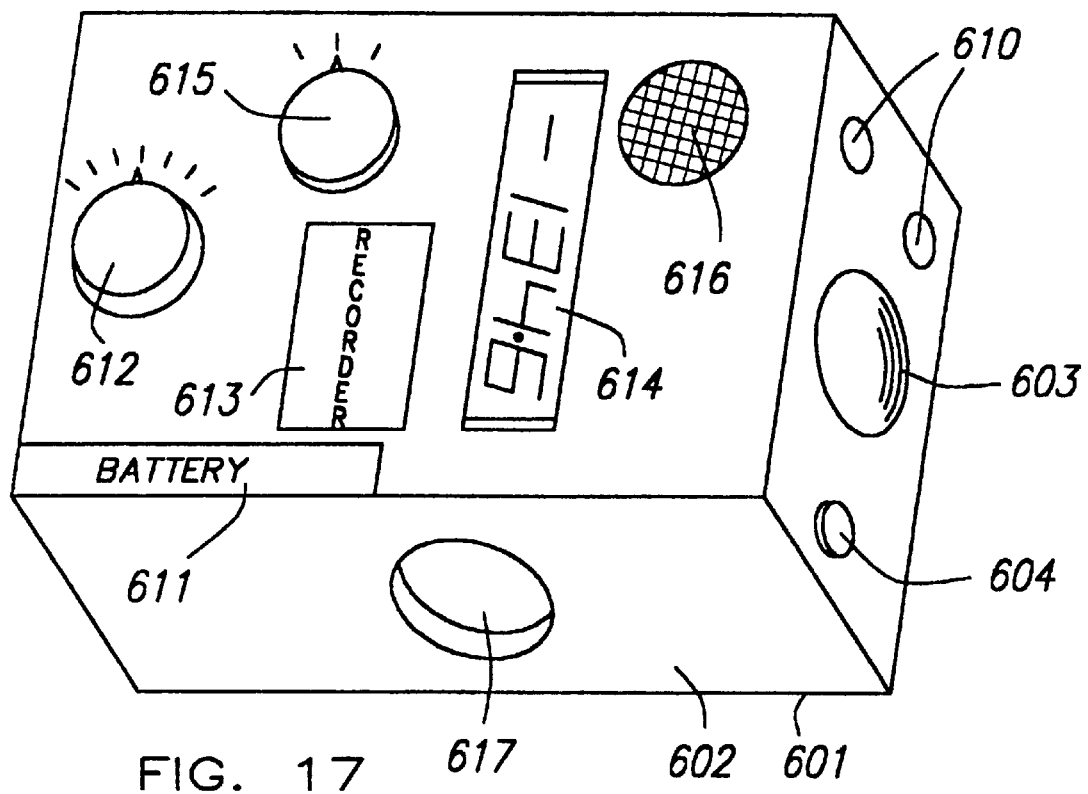
FIG. 17 is a perspective view, from the front and below and one side, of the measuring device of FIGS. 14 and 15.

At the underside of the body 602, best seen in FIG. 17, there is provided a recessed or flush clip-in, or screw in, socket 617, for the releasable engagement of a handle 618, as seen in FIG. 14, and of a tripod 619 as seen in FIG. 15. The socket 617 is positioned such that handle 618, and the tripod 619, will when in position be at a suitable point for balance of the device.

Figure 16:
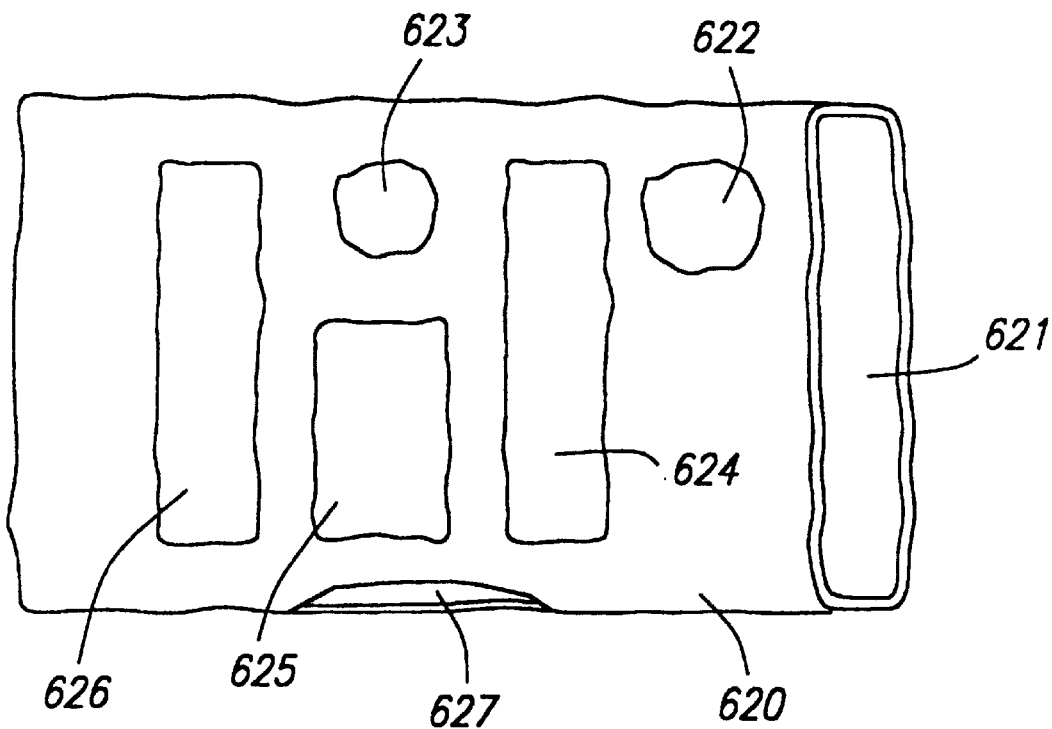
FIG. 16 is a perspective side elevation of a removable sleeve or boot for enclosing and protecting the measuring device of FIG. 14.

Referring to FIG. 16, there is shown a sleeve or boot 620, which is made of a flexible or resilient material and which is dimensioned to enclose the body 602, of the apparatus, and preferably to form a relatively tight but releasable sliding fit thereon. The sleeve 620 is open at the end 621, and has an opening 622 for the sound transducer 616, and an opening 623 for access to the timer knob 516, and an opening or transparent window 624 to permit reading of the digital meter 614, and an opening 625 for access to the recording means 613, and an opening 626 for access to the selector switch 612. If desired, another opening (not shown) would be provided for access to the battery compartment 611.

At the underside of the boot or sleeve 620 there is provided an opening 627 for access to the socket 617 on the underside of the apparatus.

The apparatus includes, in another form, means (not shown) for making a recording of the results detected, e.g. an internal tape, or a disc such as a laser compact disc, or a so-called magnetic 'floppy disc' which can later be removed and played back, for example in a computer.

The means for aiming, for example using laser light beams, are in a further embodiment provided with a glass or plastics material diffractor or beam splitter, with for example two lenses. In a further embodiment a holograph/hologram device is used to split a laser beam into multiple beams, preferably more than two, which may form a circular spot pattern.

Referring to FIGS. 18, 19 and 20, there is shown a temperature and emissivity measuring and indicating device which includes a first unit for measuring temperature, at a distance, of a selected area of a target by receiving infrared radiation from that area, and a clip-on detachable second unit for measuring temperature by direct contact with that selected area, and which further includes means for calculating emissivity from the two temperature measurements and for displaying the resultant temperatures and emissivity.

The device comprises a body 701, which, for convenience of handling, has a pistol grip 702 carrying a switch 702A. At the free end of the 'barrel' portion of the device there is positioned means 703 for receiving and measuring infrared radiation from a heated target toward which the device is presented. Detailed disclosure of the nature of such an infrared detector system is not necessary because such apparatus is already known.

For aiming the detector system accurately at a desired small area of the target, the device is provided with a pair of laser projectors 704a, 704b, for aiming respective beams of laser light onto the target at points each side of the area of target being investigated. The laser projectors, in another embodiment, are modular and removable and can be substituted by other such projectors. On top of the barrel portion 705 of the device there is mounted an optical telescope 706 to assist in proper location of the device with respect to a distant target.

At the underside of the barrel portion 705 of the device there is provided a mounting 707 detachably held on the barrel by releasable spring clips 707a, at each side, for a detector arm 708 which extends forwardly and substantially parallel to the centre line of the infrared detection system. In an alternative arrangement, the telescope is omitted and the mounting 707 is placed above the barrel portion 708, or at either side. At its free end the detector arm 708 carries a surface-contact temperature detecting unit 709 having a contact element 710, which is a thermocouple. Suitable wiring from the contact element 710 passes through the arm 708 to the mounting 707, or a flexible external cable is used. The arm 708 is permanently fixed to the mounting 707, or for example in another embodiment carries a plug at its end, adjacent the mounting, for engagement into a jack in or on the mounting 707.

Within the mounting 707, there is provided suitable electronic circuitry, incorporating for example a chip, for receiving the data derived from the infra-red measurement, and the data derived from the contact element, and for transferring the resultant to a display 711 on the barrel portion 705. Such a display is in one embodiment an electronic display, e.g. digital, on a screen 712, or a conventional analog meter or meters 713.

In one embodiment, a multi-position switch or a keypad 711A is provided on the device, for operation by the hand holding it, e.g. to activate infrared rays use, contact use, calculating emissivity, and display & any selected parameter. An important feature of the detector arm 708 is that in another embodiment it is not rigid, whilst being preferably stiff but resiliently defomable laterally so that it may, under adequate pressure, bend out of linearity. For this purpose, the arm 708 is, in one embodiment of a well-known tightly coiled spring construction, with touching turns, which permits some bending out of linearity when adequate pressure is applied. In another embodiment, it includes one or more portions of such material along its length. In one embodiment, the arm 708 is a relatively stiff but resilient material such as rubber or a plastic compound. The contact element shown as offset from the centre line of the infra-red device. In another embodiment it is permanently centrally aligned, or movable to be aligned.

Referring to FIG. 21, there is shown an arm 714, carrying a contact element 710, which is telescopic or folding/coiling along its length, for purposes of ease of collapsing for storage and/or for permitting adjustment of the distance of the device as a whole from the target so that the infra-red detector system may itself be placed at an optimum distance from the target, for example, to permit accurate focusing of the infra-red system on the target. The arm 714 is detachable and different forms and sizes are attachable.

Referring to FIG. 22 there is shown another form of arm 715 which has a so-called 'lazy tongs' pivoted construction, again to permit ease of storage and/or for adjusting to a desired distance of the device from a target.

It may be in some instances that it is desirable to present, at the free end of the detector arm 708 a contact detecting unit 709, which has a plurality of individual detectors 710a, 710b, 710c, 710d, each of which has a different range of temperature and/or sensitivity to suit the measurement being taken. For this purpose the detectors 710a, 710b, 710c, 710d, are mounted on a turret 710e. which can be rotated to and preferably held releasably in, a desired position to present a preferred detector forwardly.

Referring to FIGS. 24A and 24B, there is shown a construction in which the detector arm 708 carries at its free end a contact detecting unit 704a, which is fixed in position on the arm 708 and which has, presented forwardly on it, a plurality of contact elements 710F (only one of which is shown) which are spring-loaded axially outwardly and a selected one of which is allowed to project forwardly through an opening in a rotatable aperture disc 716.

Referring to FIGS. 25A and 25B there is shown a construction in which a detector arm 708 carries at its free end a fixed disc 717 from which project three contact heat elements 710G which are disposed at equilateral points about the centre such that in spite of the resilience of the arm 708 suitable pressure applied manually by the user to urge the contact element 710 into contact with the target will result in a three-point contact so that, if needed, a mean reading may be obtained from a somewhat wider area of the target, particularly at equal spacing about the point of the target at which the infrared detector is aimed.

Referring now to FIG. 26 there is seen a block diagram illustrating the method of arriving at resultants for (a) infra-red measurement, (b) contact thermocouple measurement, and (c) emissivity calculated from (a) and (b). An infra-red detector 718, corresponding to the receiving and measuring means 703 of FIG. 18, feeds its output to an electronic data processor 719. A direct contact thermocouple temperature detector 720 corresponding to elements 710 of FIG. 18 to 25B, feeds its respective output to the data processor 719. The data processor has a first output, which is fed to a display 721 of emissivity, as calculated from the infra-red temperature and from the direct contact thermocouple temperature. Optionally, the data processor may also feed the infrared-detected temperature and the thermocouple-detected temperature, respectively to displays 722 and 723, and/or a data logger.

In other embodiments of the constructions described, the thermocouple contact element 710 is made disconnectable and replaceable by another such head having a different temperature range and/or sensitivity.

In this embodiment, the surface thermocouple junction is aligned to the centre of the optical field of view of the infrared thermometer, and an optimum distance from 6 inches up to 24 inches from the optical lens to the surface thermocouple junction is convenient. This distance is a function of the optical field of view of the thermometer and the temperature range being measured.

When the surface probe is attached to the housing of the infra-red thermometer, and the output of the surface probe is connected to the infrared thermometer, the thermometer is then ready to measure the surface temperature of a target optically and via the surface probe.

There is an electronic function built into the apparatus to calculate the emissivity of a target based on the optical infrared energy emitted from the target and the output of the surface probe measuring the target surface temperature.

This function determines the emissivity of any surface at any temperature. The following formula shows how the emissivity is calculated:

$$E = V(T) / \{K^* \{f(T) - f(\text{Tamb})\}\}, \text{ where}$$

E—emissivity of the target surface

V (T)—The amplified output of the infrared detector measuring temperature T

K—This is the gain factor f (T)—The output of the infrared detector measuring temperature T (Referenced to 0 degree Kelvin temp)

f (Tamb)—The output of the infrared detector measuring the ambient temperature (Referenced to 0 degree Kelvin temp)

A prime advantage of the construction in accordance with the invention is that the user can hold and operate it with one hand, leaving the other hand free for whatever purpose.

Figure 27:
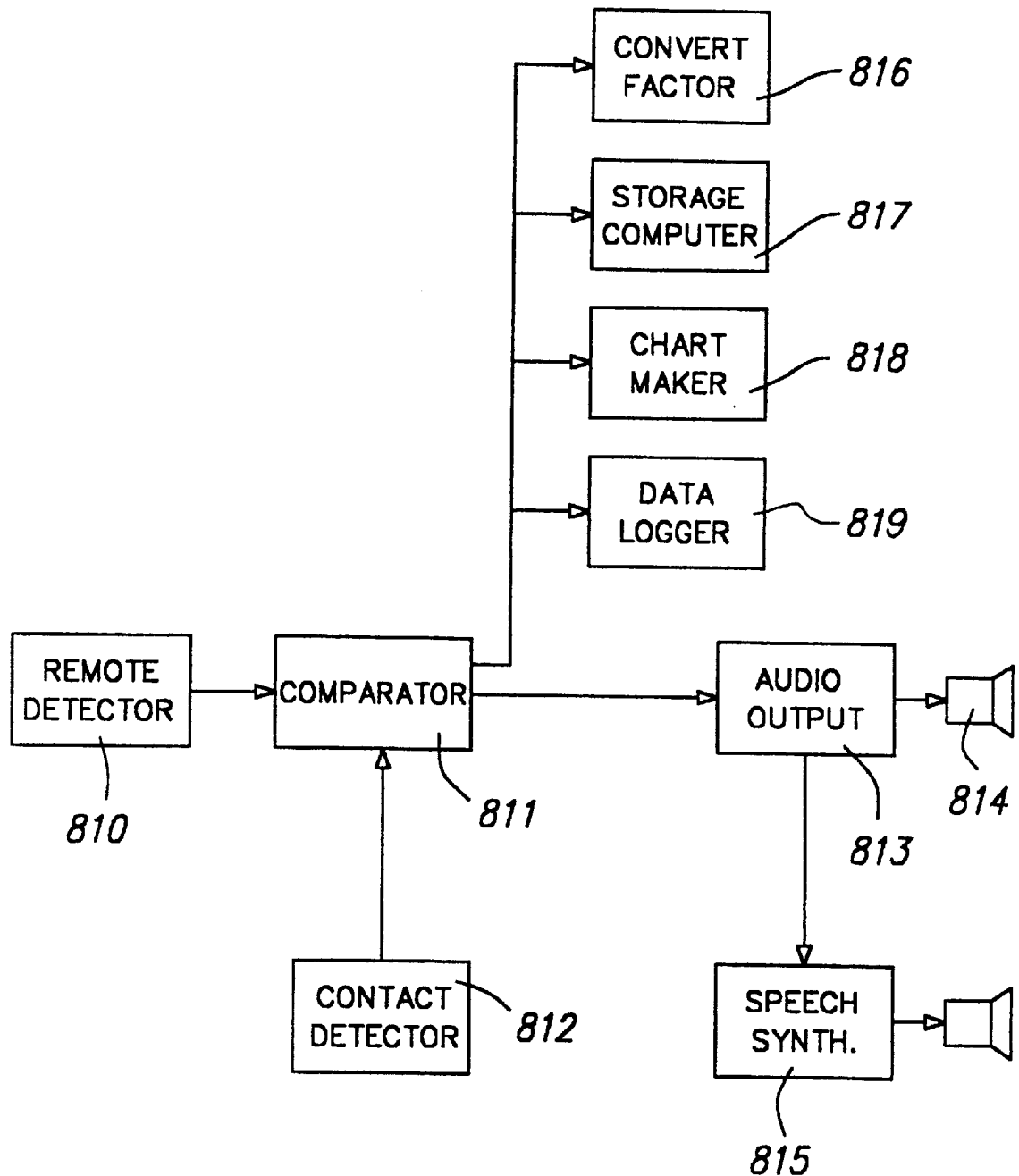
FIG. 27 is a block diagram to show both essential and optional components which are utilised in the apparatus for the provision of an audible output corresponding to a measurement of a parameter, and for simultaneous visual presentation of the measurement, and also for storage of measurements, for example in chart form.

Referring now to FIG. 27 of the drawings a remote detector 810, such as the device of FIG. 21, feeds its output to a comparator 811 which also receives another output from a direct-contact means device 812 such as a thermocouple. Such reception may also be via coded RF, AF, IR, visible, light or fibre optic. Output from the comparator 811, being a resultant of the remote and direct-contact measurements taken, is fed to a means 813 for the conversion of the measurement results into an audible form to be issued from a loud-speaker or other transducer 814. The audio output from the audible conversion means 813 is fed to a speech synthesizer 815 for the provision of the measurement results in any desired audible form, e.g. a selected language or variable tone or click.

Output from the comparator 811 is, in one embodiment, fed to a further converter 816 which is arranged to show the measurement resultant in a selected parameter range, for example, degrees Fahrenheit or degrees Centigrade where heat measurement is being made.

Output from the comparator 811 is, in one embodiment, fed optionally to means for electronic storage of the measurement or of a series of measurements, taken by the apparatus, for example to a computer system 817 arranged for display of the results and/or to a data logger 819.

Output from the comparator 811 is in one embodiment optionally fed to a means 818 for the visual storage of a measurement or of a series or range of measurements, e.g. a chart-making apparatus, and a data logger 819.

With the apparatus of the present invention, measurements taken remotely are made at long or short separations from the target, for example at 5 inches or at 5 feet.

A particular advantage of this aspect of the present invention is that it is possible to place the measuring means in a situation, which would not be suitable for an operator, for example where there is a noxious atmosphere, or risk of radiation or other hazard, and the operator can be stationed at a safe distance and can hear the test results being announced by the measuring means. The measuring means is not restricted to the measurement of temperature but can measure, assess, or compare other factors or parameters such as colour or pattern, gas content, radioactive emissions, decibels of noise when it is desirable or essential that an operator is not present at the site.

In the case of the pistol grip type of structure of the invention, and also in the meter type construction it is of particular advantage if the nature of the apparatus is readily visibly detectable by a user, both immediately and also at a distance, and for this purpose it is advantageous if the pistol grip type apparatus, and also the meter type apparatus are provided with a readily visible colouring which will indicate the nature of the apparatus, for example by providing a bright colour such as yellow or gold over a black or grey box or housing, for instance in the form of a slip-on or otherwise attachable outer resilient boot, sleeve, or jacket.

Figure 28:
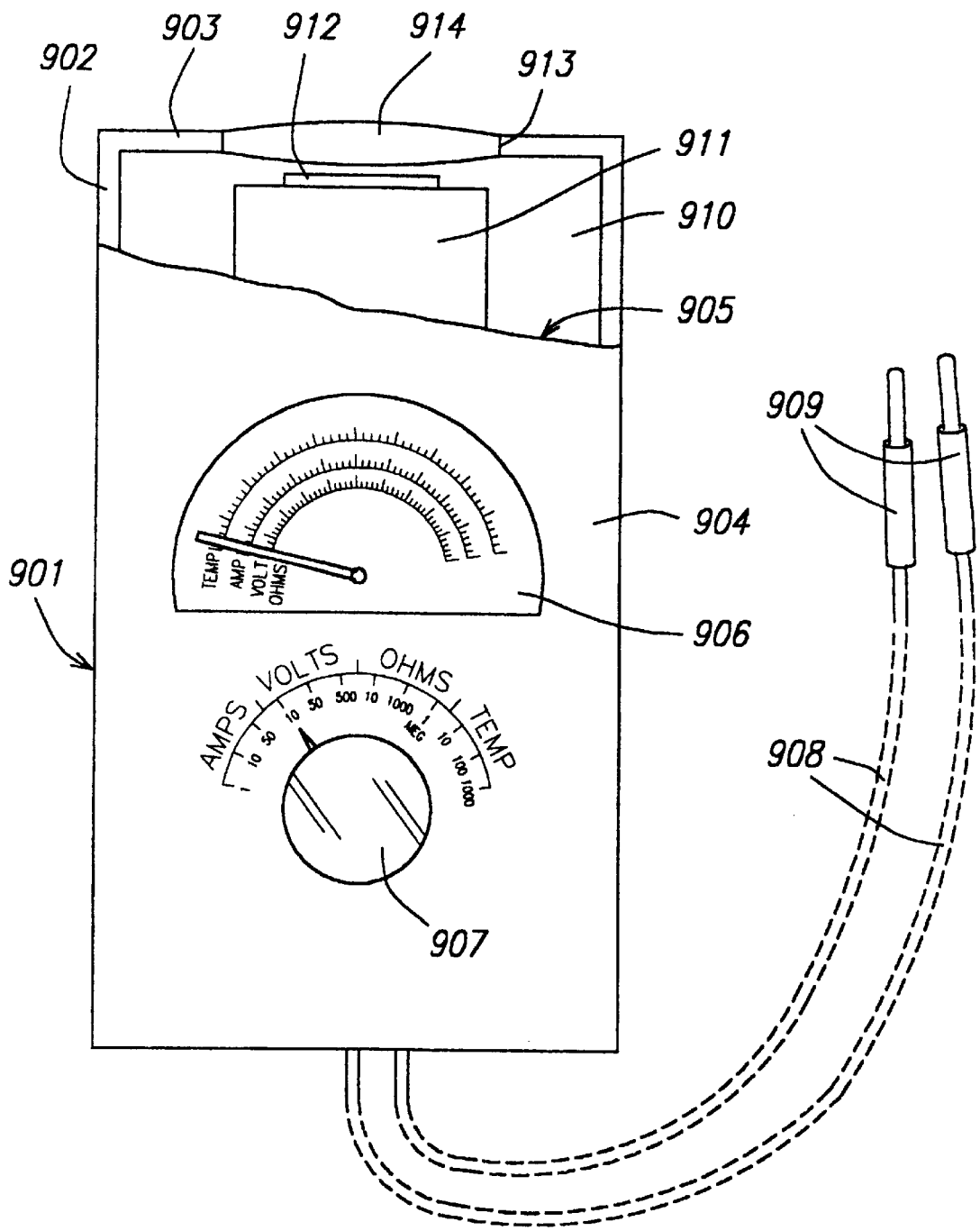
FIG. 28 is a plan view, with part shown broken away, of a representative multimeter.

Referring to the FIG. 28 of the drawing, a multi-meter denoted generally by the reference numeral 901 has a housing in the form of a rectangular hollow box with a side wall 902 and an end wall 903.

Part of a front or top wall 904 is cut away at 905 to reveal internal details.

Seen on the remainder of the top wall 904 there are the conventional multirange meter 906 and a selector knob 907 for selecting any desired one of a plurality of different ranges of a plurality of parameters.

At the other end of the meter housing 901 there are provided the usual two leads 908 terminating in probes 909 for convenience of use of the meter.

Within a compartment 910 provided at the end of the housing 901 there is disposed an infra-red detection unit 911, which has its entry end 912 disposed in alignment with an opening 913 provided in the end wall of the housing 901. According to the desired range of use of the meter for heat measurement, the opening 913 includes a lens 914 suitable for transmission and focussing of infra-red radiation.

The infra-red detection unit 911 is connected internally to the selector switch 907 and to the meter 906, so that indication of a selected range of heat measurement may be obtained. The meter in one embodiment carries an indication of a preferred distance at which the meter must be held when pointed in the direction of the heat source being measured.

In use, the meter provides all of the usual functions of known multimeters, but in addition has the capability to measure temperature by heat radiation by merely pointing the meter correctly in the direction of the heat source.

Although not shown in the drawing, a suitable closure is provided for obscuring and protecting the opening 913 and lens 914 (if provided).

In each of the aspects of the invention described, a further important feature is the provision of means for displaying visually, or audibly, the nature of the readings being obtained and in a further aspect of the invention means are provided for storing information resulting from measurements being taken, and for making a permanent record of such information in a memory, such as a computer memory, or on a recording chart or equivalent sheet, or data logger.

Such storage means are, in a further construction included in the hand-grip portion of the apparatus.

Figure 29:
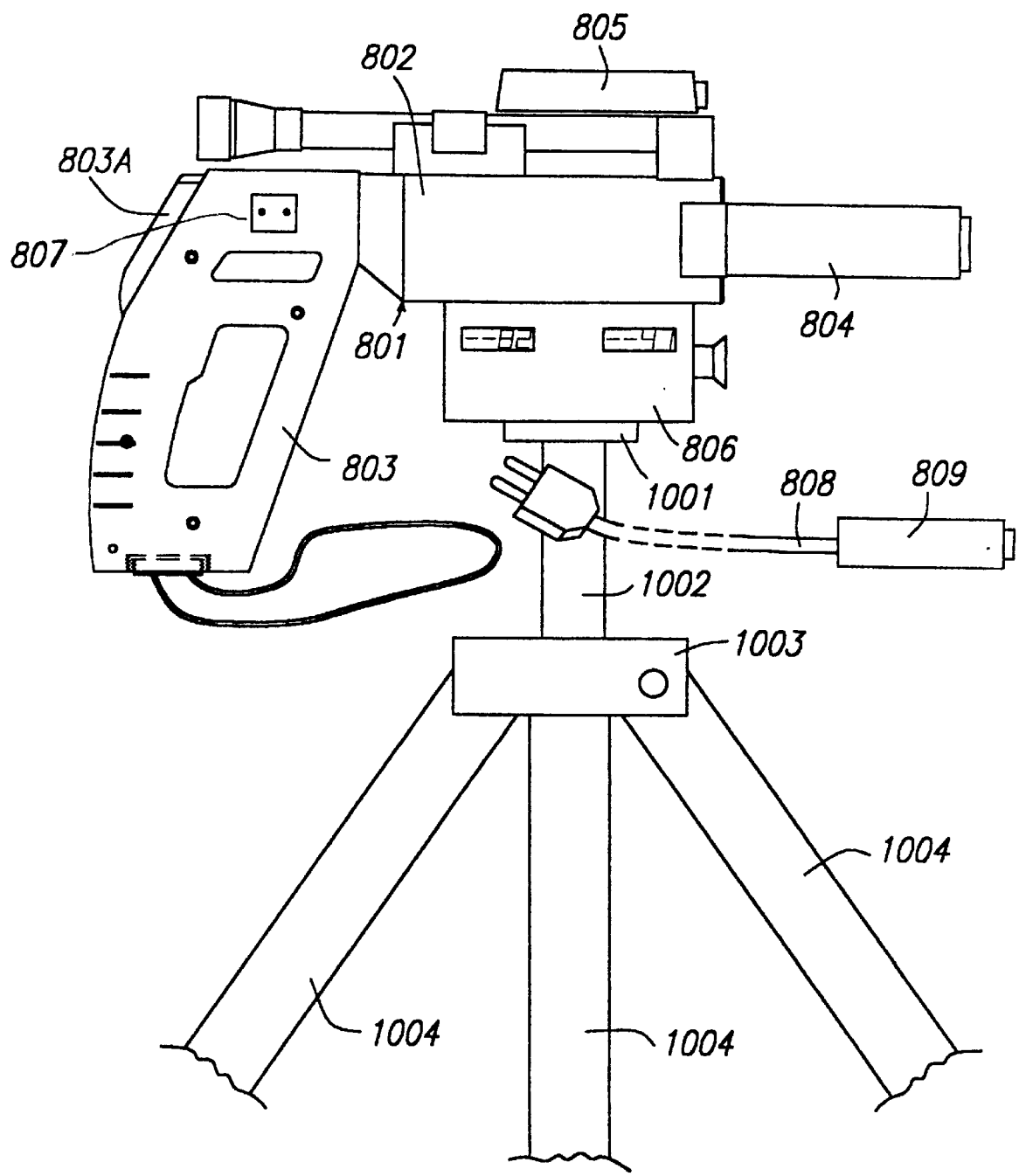
FIG. 29 is a side elevation of a temperature and emissivity measuring device which has provision for attachment to a tripod or like stand, to enable the device to be placed in a situation remote from the user.

FIG. 29 is a side elevation of a temperature and emissivity measuring device incorporating an infrared temperature detector and a clip-on detachable thermocouple contact temperature detector.

There is shown a measuring instrument denoted generally by reference numeral 801 which has a body portion 802 carried on a pistol grip 803. At the forward end of the body portions there is mounted a detector head 804. This detector is, in one embodiment, a remote temperature detector, a remote light intensity detector, a remote sound intensity detector, or a remote radiation detector. Other remote detectors, for other parameters, are in-built or are provided as separable units, which are secured in position on the body portion 802 with appropriate connections to the internal circuitry of the body portion 802 being made.

To assist in the accurate sighting of the detector head 804, the body portion 802 carries a sighting means 805. This is a simple optical device such as cross wires, or a telescope or modular, removable and exchangeable means for projecting a beam of light, such as a laser beam, or beams, or halogen beams, onto the target area, both for centering on the target area, and for defining the extent of the target area being investigated. By way of example, the laser projector or projectors project either a pair of diametrically spaced spots on the target, or a circle of such spots, with or without a centre spot from a beam splitter/defractor.

On the body portion 802 there is mounted a meter assembly 806 which is a simple multi-meter with selectable parameter ranges, or an electronic assembly capable of carrying out conversions of parameters into selectable different ranges. In particular the meter assembly 806 incorporates means for the conversion of the parameter readings into audible forms and preferably as synthesized speech indication of the parameter reading delivered to a sound transducer or loudspeaker (headphone) incorporated.

The body portion 802 further carries means 807, such as sockets, for the reception of leads 808 from another parameter reading instrument, such as a thermocouple device 809 used for placing in direct contact with a body whose temperature is to be measured.

A socket mounting 1001 receives detachably a stem 1002 of a hand-grip or a tripod structure 1003, with legs 1004, enabling the device to be set up by an operator in a desired location so that the operator does not need to remain at the location, for example in the case of a noxious or otherwise dangerous or undesirable location. Preferably, each of the measuring devices disclosed herein are provided with such a mounting and tripod supporting facility. The socket is positioned to balance the instrument at the socket.

In each of the embodiments and aspects set forth herein a further feature is the provision of digital metering as well as, or alternatively to, the analog metering described.

With each of the aspects of the present invention which have been set forth above, when an audible output is provided, for example where there is a 'talking' multimeter included, the advantage is obtained that the operator can be at a distance and for example out of visible range, and at a safe distance. The audible output may be broadcast to another room in which the user is situated or sent to headphones as a voice, tone or click.

An important further feature of the present invention relates to the manner of packaging of the meter. In a first embodiment of packaging, there is provided a box or case which is a single piece or multi-part structure made of a metal, or of a plastic material or other adequately stiff material, and shaped to receive the meter in a set position, with a cut-out space of the shape of the meter, with a small clearance, so that the meter can be easily inserted in and removed from the packaging but will be held relatively firmly for transportation purposes, and will be protected against shocks, atmospheric conditions, and dropping. Such packaging in a further embodiment is of a charcoal grey or black coloration.

In another embodiment, the packaging of the meter is in the form of a sleeve, bumper or boot which can be slipped over the meter to enclose it and give protection, and also to facilitate carrying and handling and to provide a desired different colour.

In this embodiment, the outer packaging is of a yellow or gold colour to facilitate indication both of the nature of the meter, and its origin. In order to facilitate identification of models of the meter having different functions, different sizes, different ranges, and other properties, in a further embodiment, are colour-coded appropriately.

In yet another embodiment of the meter of the present invention, the laser light or lights used for aiming of the meter at a target is replaced by incandescent light, such as a quartz halogen light, to project a beam or the dots or circle used. Such aiming means are preferably modular, removable and replaceable.

In a further embodiment, the placing of the meter into and out of operation is performed manually, by provision of a trigger, switch or toggle which can be readily operated by the hand holding the meter, so that the meter does not need to remain on permanently but can be used for short periods as necessary.

In yet another embodiment of the invention, the meter handle portion is provided with an embossed or relief surface to enhance the grip of the hand on it.

The apparatus is constructed, in a further embodiment, with means for detecting radio-active emissions. In a further embodiment, the audio output provides a change of tone, or pitch, or rate of audio emissions, to indicate measurement.

According to a further embodiment of the invention for the measurement of temperature a first value is obtained by use of a contact thermometer, and a second value is obtained by a non-contact thermometer, and there is used a correction factor derived from the contact thermometer measurement and from the non-contact thermometer measurement, and that correction factor is used to modify the measurement of the non-contact thermometer so as to provide a read-out of the correct non-contact thermometer temperature. For the contact thermometer there may be used a thermocouple or a thermistor, and for the non-contact thermocouple there may be used a themopile or a thermistor bolometer.

The apparatus used may include switch means for switching the apparatus into contact measurement mode and into non-contact measurement mode, and for switching into and out of operation of the laser light or other light aiming beam or beams, and including or omitting a correction factor if required.

Correction factors may be provided, by the electronic circuitry, to allow for errors which may arise from such circumstances as (i) the contact thermometer being at a significantly lower temperature than the surface to be measured, (ii) the contact thermometer being at a significantly higher temperature than the surface to be measured, and (iii) extraneous radiation occurring from the surroundings and affecting measurement. The contact measurement temperature, and the non-contact measurement temperature, and the resultant obtained from the use of both of them may conveniently be shown on a liquid-crystal display.

Advantageously, the apparatus includes a display indicating the type and extent of the correction factor being imported. Provision may be made to determine, and to indicate to the user, say by a visible and/or audible signal, when a correction factor is both below and above a predetermined limit.

Means may be provided for determining, and for indicating to a user of the apparatus, whether and when the measurement to be taken is better taken solely as a contact measurement, or solely as a radiation measurement, and or a combination of both measurements.

It is a major feature and advance, in the art, of the present invention that measurements and other data determined by the instrument are available in audio form and particularly as the spoken word, for which purpose the apparatus includes for example a microchip, or multiple microchips,e providing one or a number of different languages.

Advantageously, the measuring instrument is provided with data logging means, which may be removable, whereby the totality of the readings, plus time, date and other information, is fully recorded, although only a selected one, or selected ones, of the measurements may be displayed, read out, or given out vocally, at any one time.

In a further embodiment, information corresponding to parameter measurements is transmitted from the measuring instrument by, for example, infra-red signals of known kind, to a receptor used by the operator, which also serves to record data, for example at a safe distance from a hazardous site.

In a still further embodiment, the measuring instrument is operated from a distance by a remote control handset or console used by an operator and transmitting instructions to the measuring instrument, for example by infrared signals.

A further feature is that the operator can see and/or listen to output information from the measuring instrument whilst the instrument is measuring another parameter and/or another range of a parameter.

Where laser or other light spots are projected onto the target, such spots are in different embodiments, a pair with one spot at the centre and one peripheral, or two spots diametrically opposed, or on respective radii. In other embodiments, the spots are replaced by more than two spots, e.g. a circle, or an intersecting pair of lines, or parallel lines.

Where aiming devices, such as laser light projectors, are shown herein as built-in, they are in further embodiments provided as mountable and dismountable, and for example as plug-in units.

The invention provides a method for derivation of the temperature of a target by obtaining a contact temperature measurement by contacting the target with a temperature sensor, such as a thermocouple, RTD, or thermistor, obtaining a non-contact temperature measurement by sensing infra-red radiation from the target, or a selected area of the target, and deriving by calculation from those two measurement a true temperature resultant. The method may include the use of a known constant correction factor, or of correction factor derived from difference between the contact measurements and the non-contact measurement.

In all instances herein where reference is made to a thermistor, it is to be assumed that a thermocouple or RTD may be used. The method may further include the use of correction factor, which is derived from extra-high and/or extra-low differences between the two measurements. The method may further include the determining of any disturbance factor deriving from the presence of extraneous radiation affecting the non-contact measurement, and the use of that disturbance factor as a correction for the temperature resultant obtained.

All of the measurements made by the embodiments of the present invention may be recorded on a removable 1.44 MB floppy disk in the manner of a digital photographic camera and then displayed on a computer or printer. The construction of the instrument may embody a known device from the digital photographic camera art, which records radiation and electrical detected signals on the integral removable internal disk for display and for processing elsewhere.

Two or more instruments of the kinds described herein may be linked together from different locations to provide a network and to survey a number of different sites or parameters in an integrated measurement system.

We claim:

1. A method of measurement and data display in a one hand held instrument comprising:

aiming a device with a laser at a remote measurement location and colelcting measurements by infrared radiation; and contacting said location with a detector connected and supported upon a body of said one hand held instrument to said instrument, whereby the contact and non-contact measurements are collected, compared, and displayed by said instrument.

2. In a unitary hand held emissivity measurement instrument for single hand operation on a target comprising:

a) a multimeter including a disiplay;

b) a contact thermometer; and c) a non-contact radiometer, the improvement comprising:

laser radiometer targeting means directing said radiometer; a contact thermometer probe supported on said instrument; and means for displaying target emissivity by the combination of both contact and non-contact temperature determination from the same target by the radiometer and probe in the same instrument.

* * * * *